United States Patent [19]
Nishioka et al.

[11] Patent Number: 5,994,733
[45] Date of Patent: Nov. 30, 1999

[54] NONVOLATILE SEMICONDUCTOR MEMORY DEVICE AND METHOD OF FABRICATING THE SAME

[75] Inventors: Naho Nishioka; Natsuo Ajika; Hiroshi Onoda, all of Hyogo, Japan

[73] Assignee: Mitsubishi Denki Kabushiki Kaisha, Tokyo, Japan

[21] Appl. No.: 09/003,641

[22] Filed: Jan. 7, 1998

[30] Foreign Application Priority Data

Jun. 24, 1997 [JP] Japan ................................ 9-167404

[51] Int. Cl.⁶ .................................................. H01L 29/94
[52] U.S. Cl. .......................... 257/316; 257/315; 257/319; 257/506; 257/509
[58] Field of Search .................... 257/315, 316, 257/319, 399, 506, 509

[56] References Cited

U.S. PATENT DOCUMENTS 4,905,062  2/1990  Esquivel et al. ..................... 257/316
5,859,459  1/1999  Ikeda ................................... 257/374

FOREIGN PATENT DOCUMENTS 2-239671  9/1990  Japan .

OTHER PUBLICATIONS

"A Variable–Size Shallow Trench Isolation (STI) Technology with Diffused Sidewall Doping for Submicron CMOS", B. Davari et al., IEDM, 1988, pp. 92–95.

"A Novel Side–Wall Transfer–Transistor Cell (SWATT CELL) for Multi–Level Nand EEPROMs", S. Aritome et al., IEEE, 1995, pp. 275–278.

*Primary Examiner*—Valencia Martin-Wallace
*Attorney, Agent, or Firm*—McDermott, Will & Emery

[57] ABSTRACT

Each nonvolatile transistor comprises a floating gate electrode, an ONO film and a control gate electrode. An upper surface of a silicon oxide film is positioned at a height between upper and lower surfaces of the floating gate electrode. The control gate electrode continuously extends on the floating gate electrode and the silicon oxide film in a prescribed arrangement direction.

3 Claims, 26 Drawing Sheets

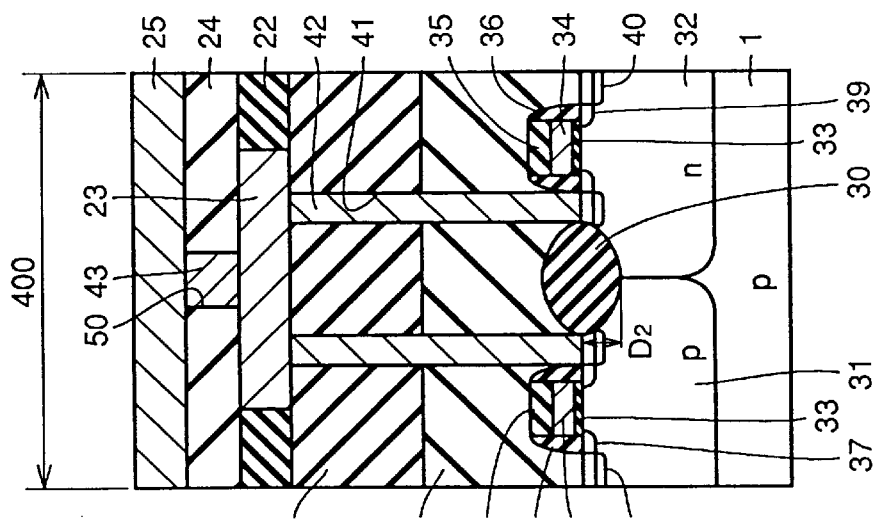
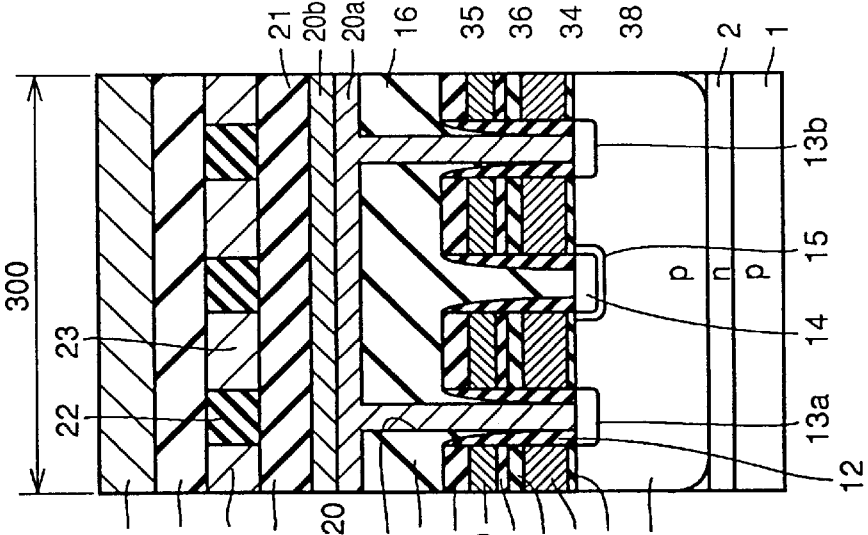
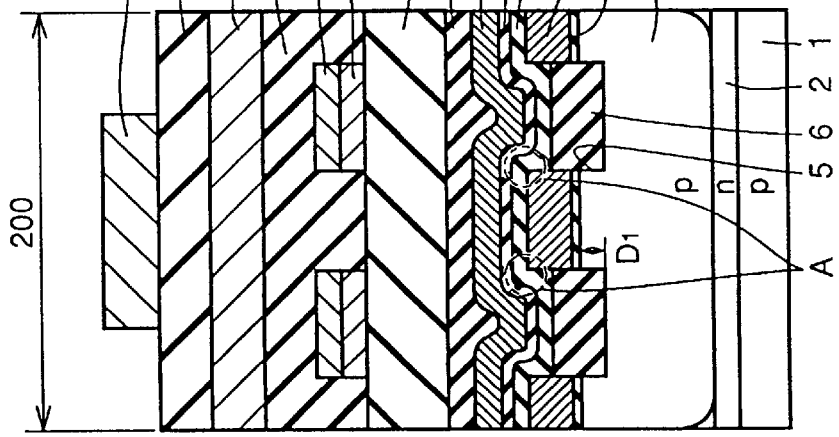

FIG. 3A   FIG. 3B   FIG. 3C
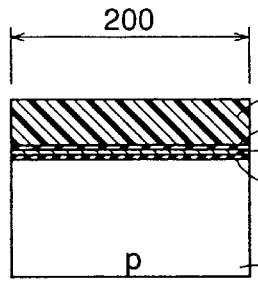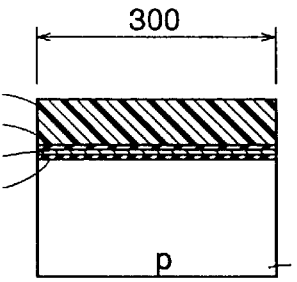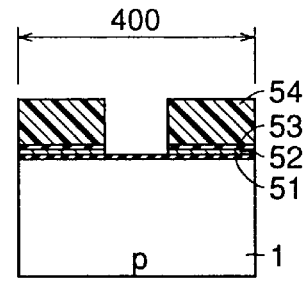
FIG. 4A   FIG. 4B   FIG. 4C
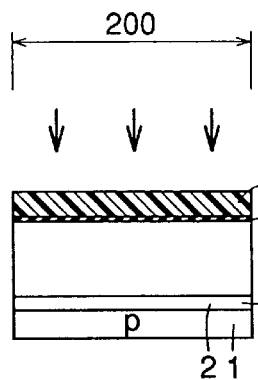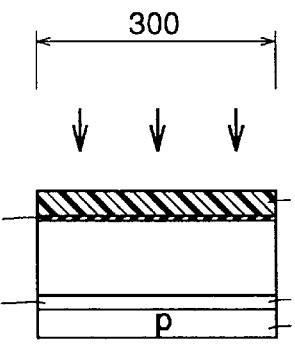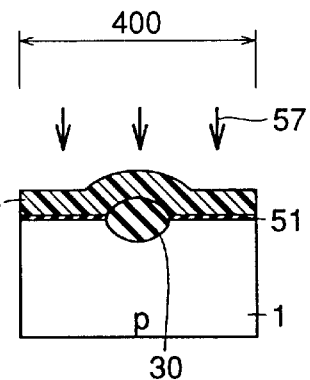
FIG. 5A   FIG. 5B   FIG. 5C
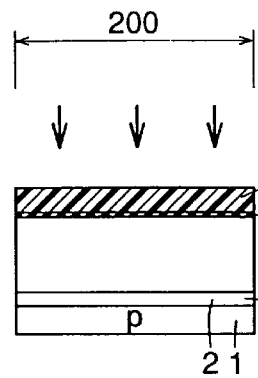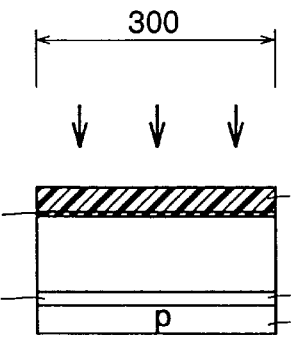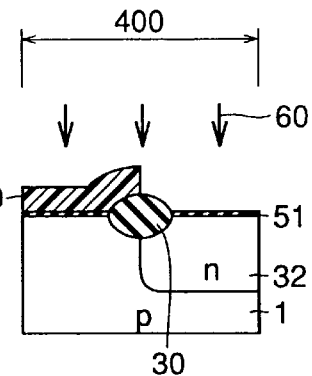

FIG. 6A    FIG. 6B    FIG. 6C
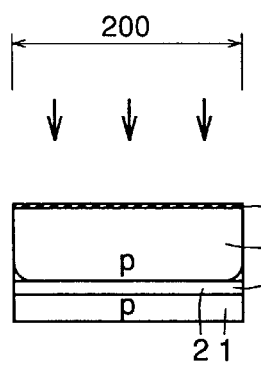 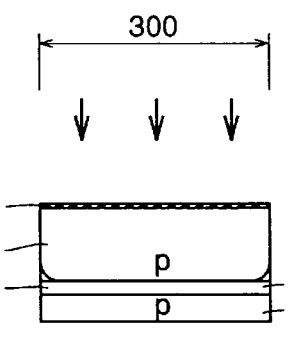 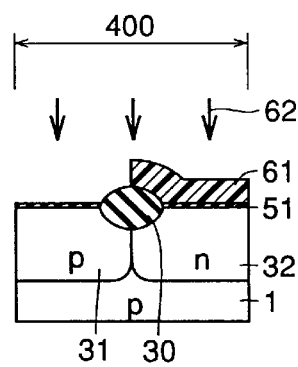
FIG. 7A    FIG. 7B    FIG. 7C
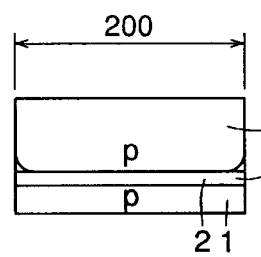 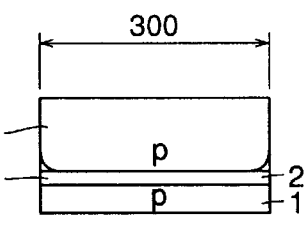 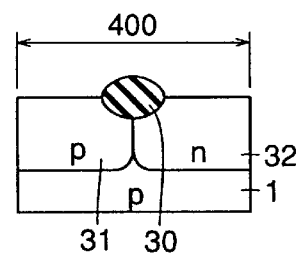
FIG. 8A    FIG. 8B    FIG. 8C
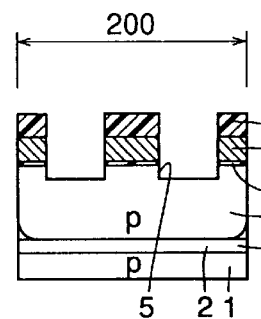 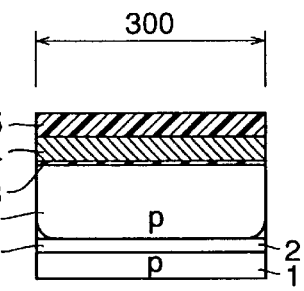 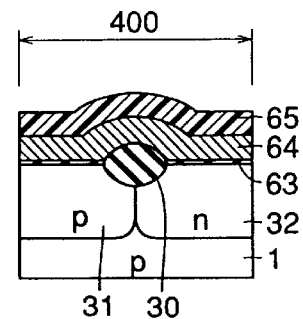

FIG. 9A  FIG. 9B  FIG. 9C
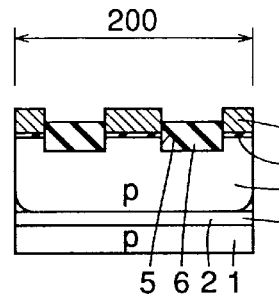 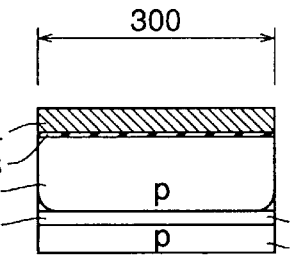 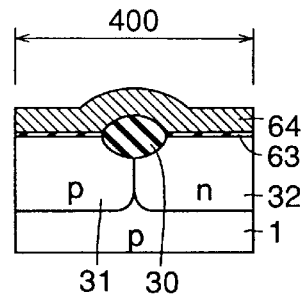
FIG. 10A  FIG. 10B  FIG. 10C
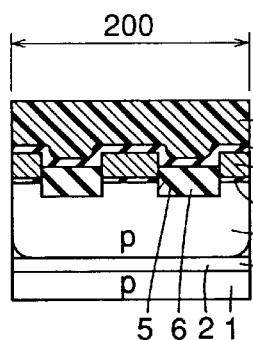 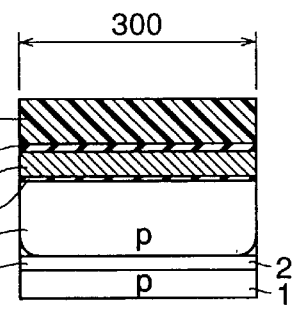 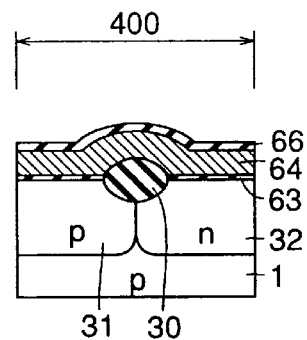
FIG. 11A  FIG. 11B  FIG. 11C
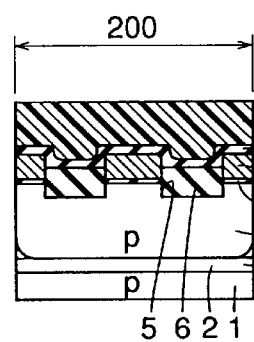 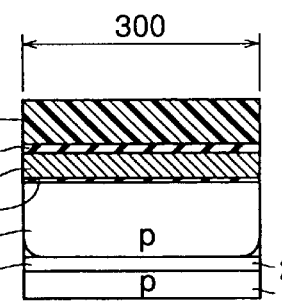 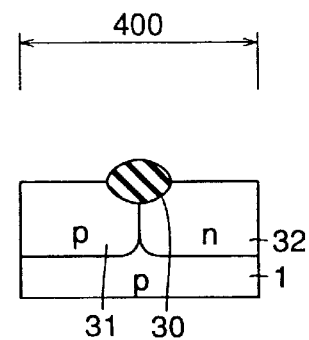

FIG. 12A   FIG. 12B   FIG. 12C
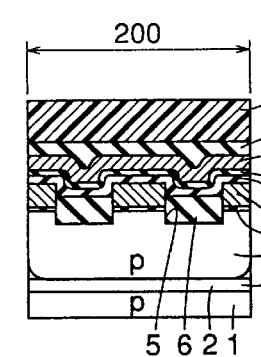 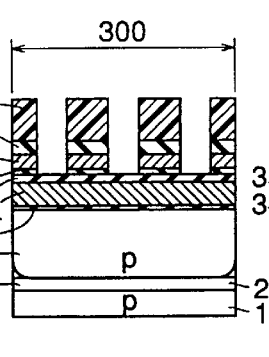 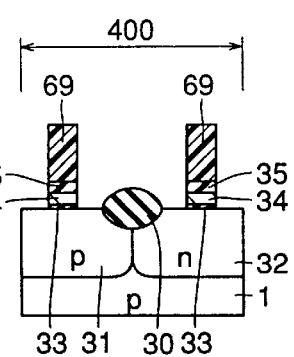
FIG. 13A   FIG. 13B   FIG. 13C
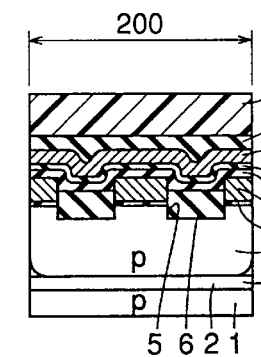 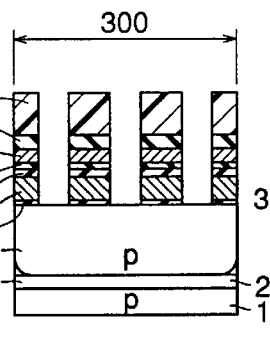 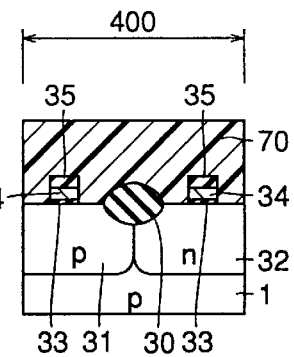
FIG. 14A   FIG. 14B   FIG. 14C
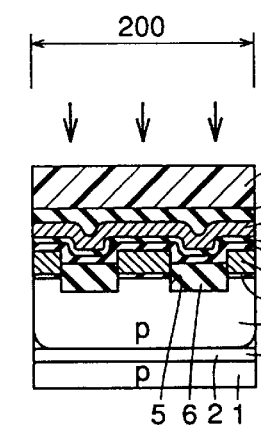 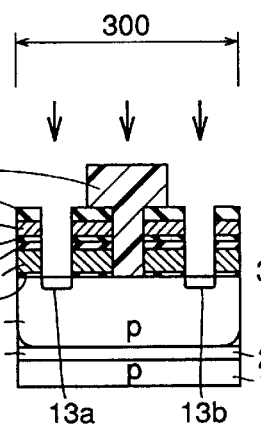 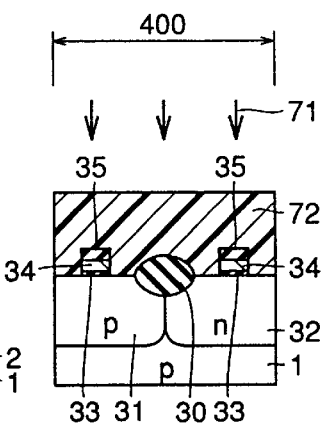

FIG. 15A    FIG. 15B    FIG. 15C
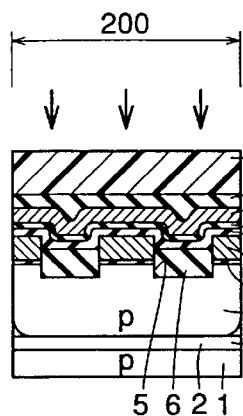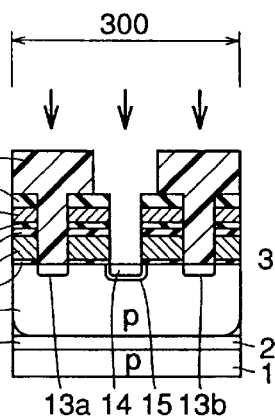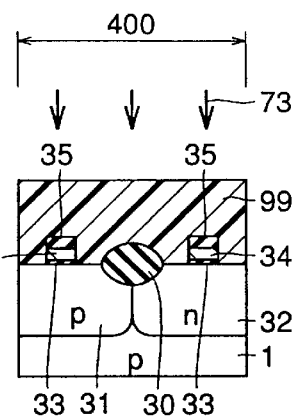
FIG. 16A    FIG. 16B    FIG. 16C
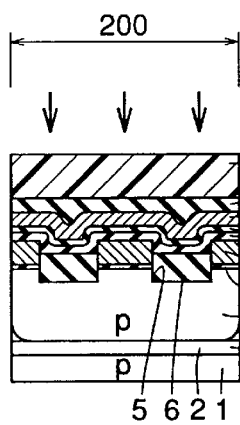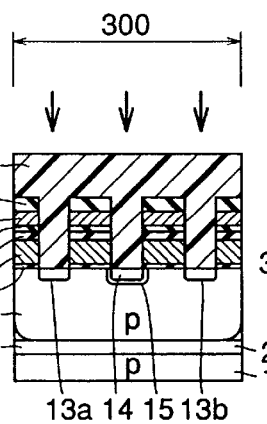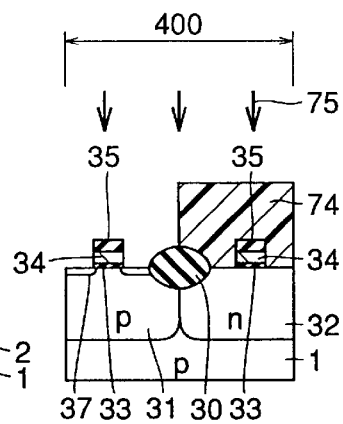
FIG. 17A    FIG. 17B    FIG. 17C
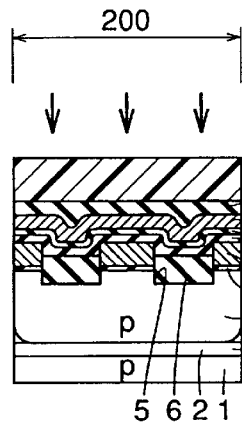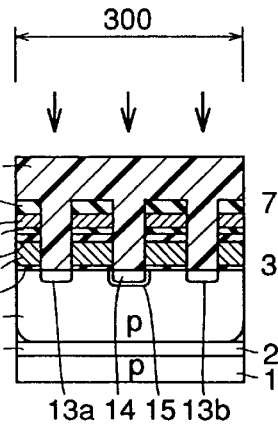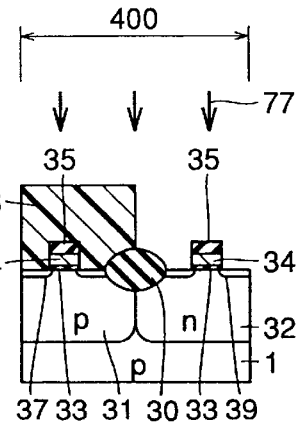

FIG. 18A  FIG. 18B  FIG. 18C
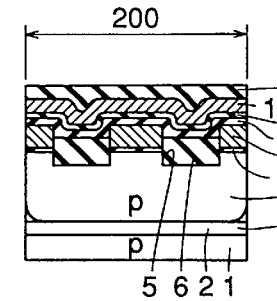 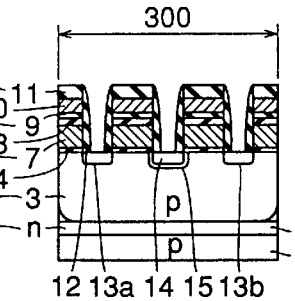 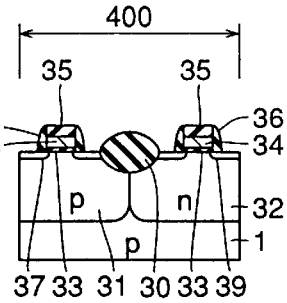
FIG. 19A  FIG. 19B  FIG. 19C
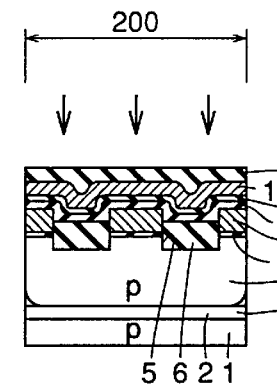 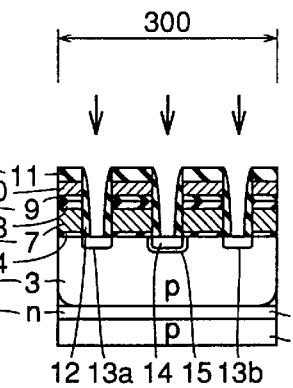 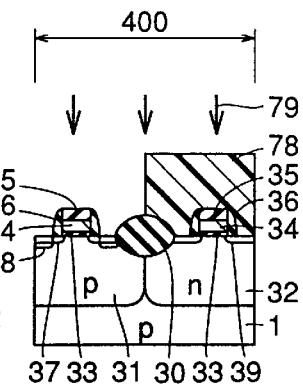
FIG. 20A  FIG. 20B  FIG. 20C
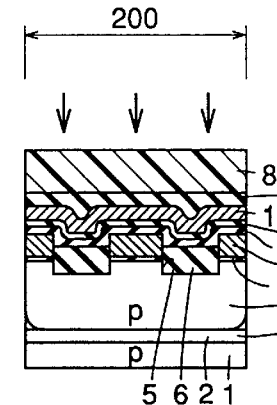 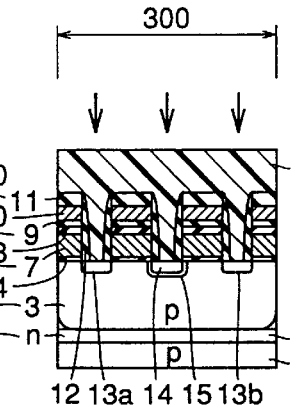 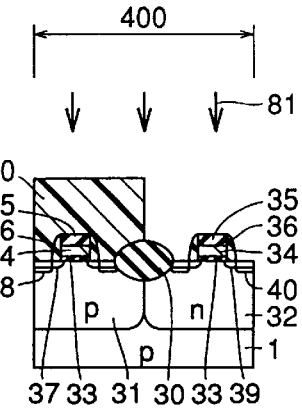

FIG. 23A
FIG. 23B
FIG. 23C
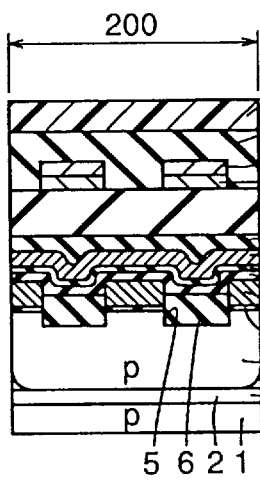
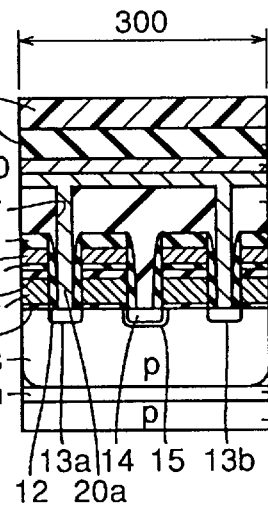
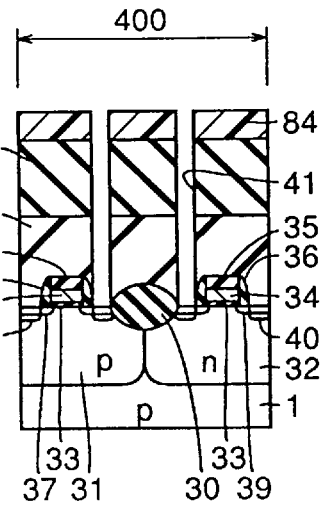
FIG. 24A
FIG. 24B
FIG. 24C
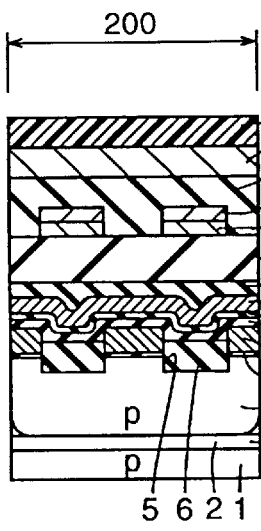
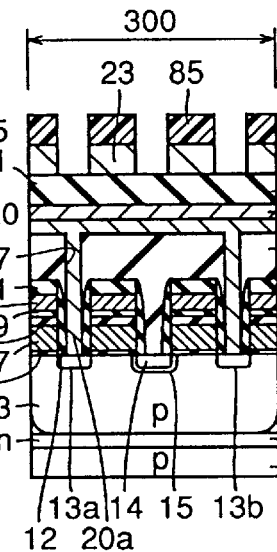
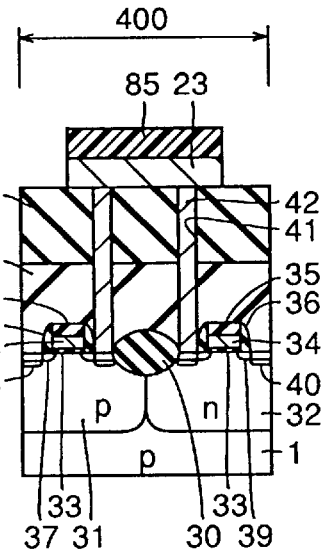

FIG. 27A          FIG. 27B          FIG. 27C
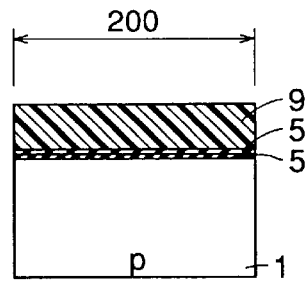 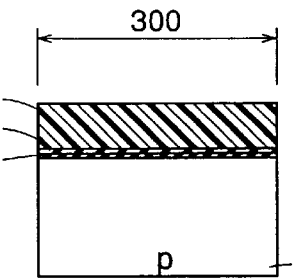 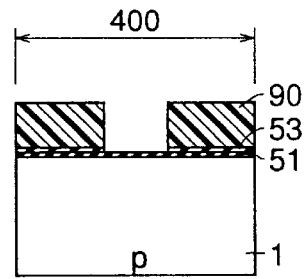
FIG. 28A          FIG. 28B          FIG. 28C
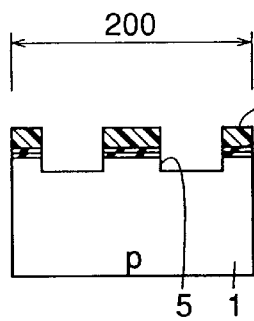 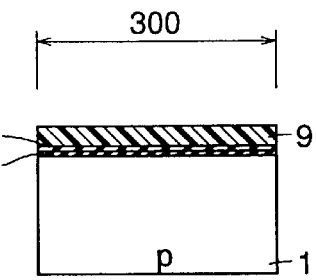 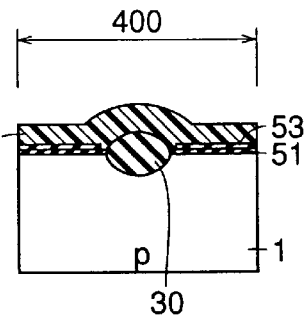
FIG. 29A          FIG. 29B          FIG. 29C
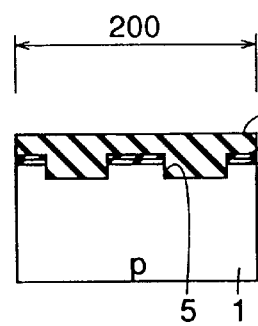 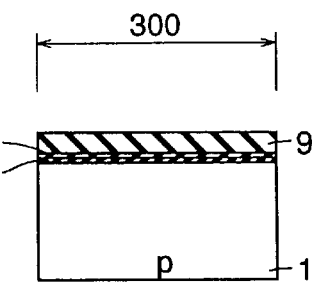 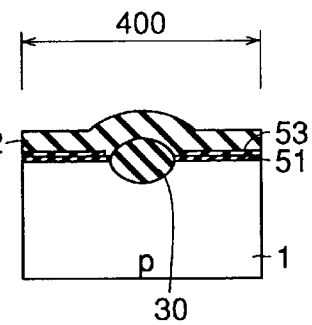

FIG. 30A
FIG. 30B
FIG. 30C
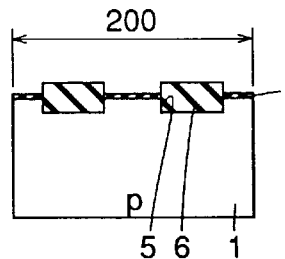
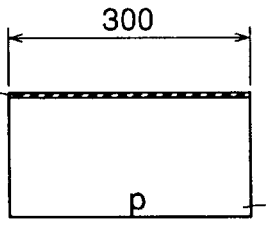
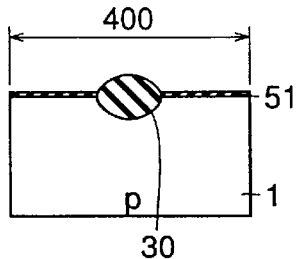
FIG. 31A
FIG. 31B
FIG. 31C
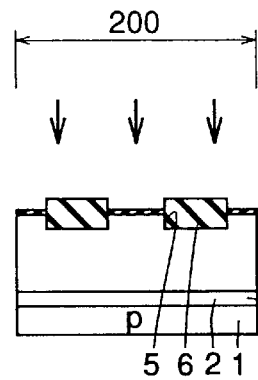
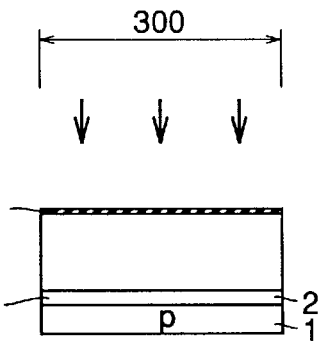
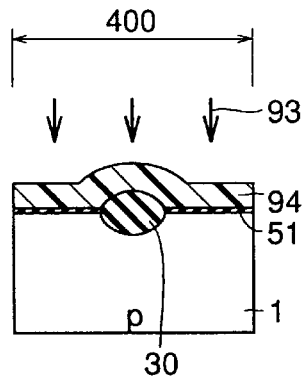
FIG. 32A
FIG. 32B
FIG. 32C
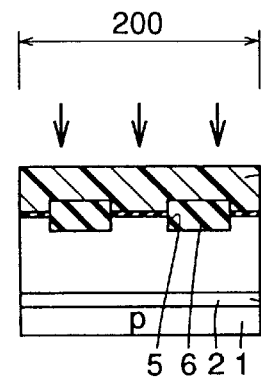
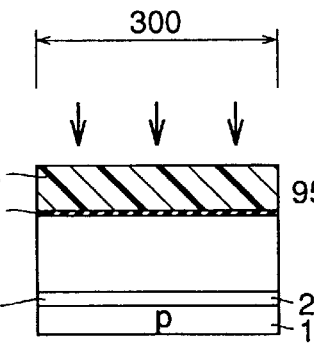
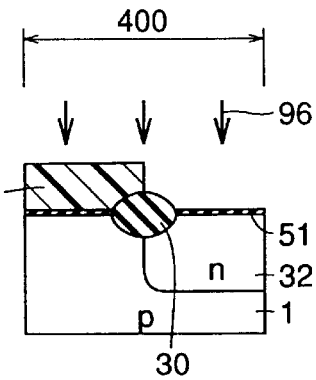

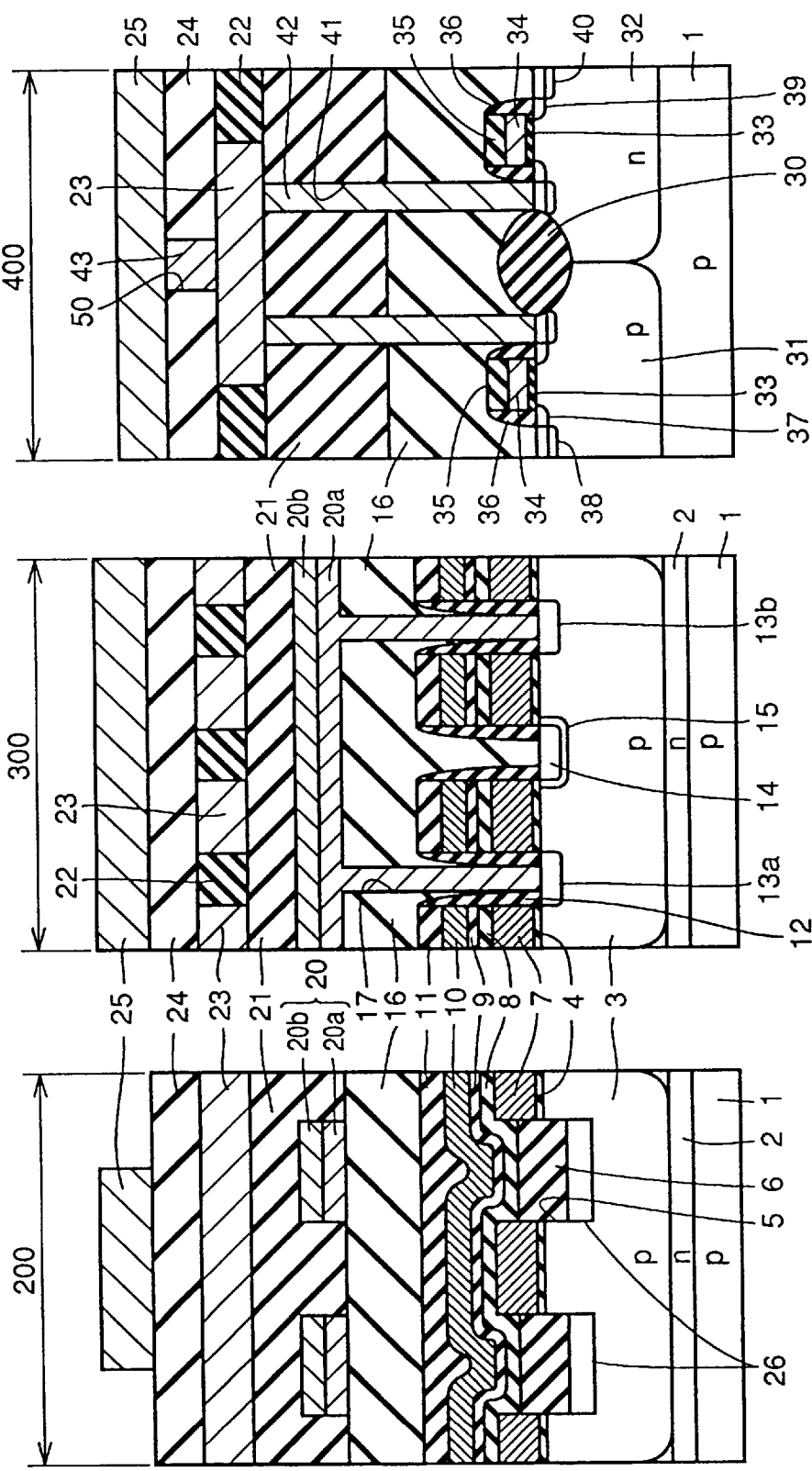

NONVOLATILE SEMICONDUCTOR MEMORY DEVICE AND METHOD OF FABRICATING THE SAME

BACKGROUND OF THE INVENTION

1. Field of the Invention

The present invention relates to a nonvolatile semiconductor memory device and a method of fabricating the same, and more particularly, it relates to an electrically erasable and programmable read only memory (EEPROM), i.e., the so-called flash memory, and a method of fabricating the same.

2. Description of the Background Art

In general, an EEPROM capable of freely programming data and electrically writing and erasing information is known as one of nonvolatile semiconductor memory devices. However, a selection transistor and a memory cell transistor are required for each memory cell, and hence it is disadvantageously difficult to implement this EEPROM which can advantageously electrically write and erase information with higher density of integration. To this end, there has been proposed a flash EEPROM which has memory cells each formed by a single transistor and is capable of electrically batch-erasing written information charges.

FIG. 43 is a block diagram showing a general structure of such a flash memory. Referring to FIG. 43, the flash memory includes a memory cell matrix 1100, an X address decoder 1200, a Y gate 1300, a Y address decoder 1400, an address buffer 1500, a write circuit 1600, a sense amplifier 1700, an input/output buffer 1800, and a control logic element 1900.

The memory cell matrix 1100 is provided in its interior with a plurality of memory cell transistors which are arranged in rows and columns. The X address decoder 1200 and the Y gate 1300 are connected to the memory cell matrix 1100. The X address decoder 1200 and the Y gate 1300 are adapted to select the rows and columns of the memory cell matrix 1100 respectively. The Y address decoder 1400 is connected to the Y gate 1300. The Y address decoder 1400 is adapted to supply column selecting information. The address buffer 1500 is connected to the X address decoder 1200 and the Y address decoder 1400. The address buffer 1500 is adapted to temporarily store address information.

The write circuit 1600 and the sense amplifier 1700 are connected to the Y gate 1300. The write circuit 1600 is adapted to perform a write operation in data inputting/outputting. The sense amplifier 1700 is adapted to determine "0" or "1" from the value of a current flowing in data outputting. The input/output buffer 1800 is connected to the write circuit 1600 and the sense amplifier 1700. The input/output buffer 1800 is adapted to temporarily store input/output data.

The control logic element 1900 is connected to the address buffer 1500 and the input/output buffer 1800. The control logic element 1900 is adapted to control operations of the flash memory. The control logic element 1900 performs control on the basis of a chip enable signal/CE, an out chip enable signal/OE and a program signal. Symbol "/" for the signals/CE and/OE indicates inversion.

FIG. 44 is an equivalent circuit diagram illustrating a schematic structure of the memory cell matrix 1100 shown in FIG. 43. Referring to FIG. 44, a plurality of word lines $WL_1, WL_2, \ldots, WL_i$ and a plurality of bit lines $BL_1, BL_2, \ldots, BL_j$ are arranged in the memory cell matrix 1100 to intersect with each other, for forming a matrix. The plurality of word lines $WL_1, WL_2, \ldots, WL_i$ are connected to the X address decoder 1200 and arranged along the rows. On the other hand, the plurality of bit lines $BL_1, BL_2, \ldots, BL_j$ are connected to the Y gate 1300 and arranged along the columns.

Memory transistors Q11, Q12, ..., Qij are arranged on the intersections between the word lines $WL_1, WL_2, \ldots, WL_i$ and the bit lines $BL_1, BL_2, \ldots, BL_j$ respectively. Drains of the memory transistors Q11, Q12, ..., Qij are connected to the bit lines $BL_1, BL_2, \ldots, BL_j$ respectively. Control gates of the memory transistors Q11, Q12, ..., Qij are connected to the word lines $WL_1, WL_2, \ldots, WL_i$ respectively. Sources of the memory transistors Q11, Q12, ..., Qij are connected to source lines $S_1, S_2, \ldots, S_i$ respectively. The sources of the memory cell transistors belonging to the same rows are connected with each other.

The structures of the memory transistors forming the conventional flash memory are now described.

FIG. 45 is a partial plan view showing a schematic structure of the memory cell matrix 1100 of the conventional flash memory. FIG. 46 is a sectional view taken along the line D–D' in FIG. 45.

Mainly referring to FIG. 46, drain diffusion regions 1013 and source diffusion regions 1012 are formed on a major surface of a p-type silicon substrate 1001 to hold channel regions 1002 therebetween at prescribed intervals. Floating gate electrodes 1004 are formed on the channel regions 1002 through thin oxide films 1003 of about 100 Å in thickness. Control gate electrodes 1006 are formed on the floating gate electrodes 1004 through interlayer insulating films 1005. The floating gate electrodes 1004 and the control gate electrodes 1006 are made of polycrystalline silicon (hereinafter referred to as doped polysilicon) into which impurities are introduced. A thermal oxide film 1051 is formed to cover the p-type silicon substrate 1001, the floating gate electrodes 1004 and the control gate electrodes 1006. Further, a smooth coating film 1008 consisting of an oxide film or the like is formed to cover the floating gate electrodes 1004 and the control gate electrodes 1006.

The smooth coating film 1008 is provided with contact holes 1009 reaching partial surfaces of the source diffusion regions 1012. Bit lines 1052 are extendedly formed on the smooth coating film 1008, to be electrically connected with the source diffusion regions 1012 through the contact holes 1009.

Mainly referring to FIG. 45, a plurality of word lines 1006 and a plurality of bit lines 1052 are arranged to intersect with each other. The word lines 1006 are integrated with a plurality of control gate electrodes 1006. In the intersections between the word lines 1006 and the bit lines 1052, the floating gate electrodes 1004 are formed under the control gate electrodes 1006. A LOCOS (local oxidation of silicon) oxide film 1053 is formed on each pair of floating gate electrodes 1004 belonging to each adjacent columns.

With reference to FIG. 47, a write operation of the flash EEPROM utilizing channel hot electrons is now described. Voltages $V_{D1}$ and $V_{G1}$ of about 4 to 6 V and about 10 to 15 V are applied to the drain diffusion region 1013 and the control gate electrode 1006 respectively. Due to the application of the voltages $V_{D1}$ and $V_{G1}$, a number of high energy electrons are generated in the vicinity of the drain diffusion region 1013 and the oxide film 1003. Parts of the electrons are injected into the floating gate electrode 1004. When the electrons are thus stored in the floating gate electrode 1004, a threshold voltage $V_{TH}$ of each memory transistor is increased. Such a state that the threshold value $V_{TH}$ exceeds a prescribed value is a written state called a state of "0".

Referring to FIG. 48, an erasing operation utilizing an F-N (Fowler-Nordheim) tunnel phenomenon is now described. A voltage $V_S$ of about 10 to 12 V is applied to the source diffusion region 1012, the control gate electrode 1006 is brought to a ground potential, and the drain diffusion region 1013 is maintained in a floating state. Due to an electric field by the voltage $V_S$ applied to the source diffusion region 1012, electrons stored in the floating gate electrode 1004 pass through the thin oxide film 1003 by the F-N tunnel phenomenon. Due to such extraction of the electrons from the floating gate electrode 1004, the threshold value $V_{TH}$ of the memory transistor is reduced. Such a state that the threshold voltage $V_{TH}$ is reduced below a prescribed value is an erased state called a state of "1".

In a read operation, voltages $V_{G2}$ and $V_{D2}$ of about 5 V and about 1 to 2 V are applied to the control gate electrode 1006 and the drain diffusion region 1013 respectively in FIG. 46. At this time, the aforementioned state of "1" or "0" is determined on the basis of whether or not a current flows to the channel region 1002 of the memory transistor, i.e., whether the memory transistor is in an ON state or an OFF state. Thus, information is read. This flash memory requires the aforementioned high voltages in operation. Thus, LOCOS oxide films are employed for isolating the elements from each other in both of a memory cell part provided with the memory transistors and a peripheral circuit part. These oxide films, which are formed in the same step, are necessarily identical in thickness to each other in the memory cell part and the peripheral circuit part.

Following recent refinement of semiconductor memory devices, it is necessary to reduce LOCOS oxide films in size, i.e., to reduce the thicknesses thereof. In a flash memory, the thickness of such LOCOS oxide films may be reduced so that impurity regions serving as channel stoppers are formed under these oxide films, since high voltage resistance is required in a peripheral circuit and memory cells. When the channel stopper regions are formed under the LOCOS oxide films, however, these channel stopper regions form p-n junctions with impurity regions around the surface of the semiconductor substrate, to disadvantageously reduce the voltage resistance. When the elements are isolated from each other in both of the memory cell part and the peripheral circuit part by LOCOS oxide films, therefore, the density of integration is limited to a constant level.

Japanese Patent Laying-Open No. 2-239671 (1990) discloses a nonvolatile semiconductor memory device comprising a trench-isolated memory cell part and a peripheral circuit part isolated by a LOCOS oxide film for solving the aforementioned a problem. FIGS. 49 to 53 are sectional views showing the nonvolatile semiconductor memory device described in the aforementioned gazette and a method of fabricating the same. In the method described in this gazette, first element isolation insulating films 2002 of 6000 Å in thickness are formed on a silicon semiconductor substrate 2001 by selective oxidation, as shown in FIG. 49. Further, gate insulating films 2003 of 200 Å in thickness are formed in active regions by thermal oxidation. Then, polycrystalline silicon doped with an n-type impurity is deposited in a thickness of 2000 Å, for forming a first semiconductor material film 2004. Then, the first semiconductor material film 2004 is oxidized at a temperature 1150° C. for forming a semiconductor material insulating film 2005 of 300 Å in thickness on its surface, and polycrystalline silicon doped with an n-type impurity is further deposited thereon in a thickness of 1500 Å for forming a second semiconductor material film 2006. Then, a photoresist material is patterned for forming a mask 2007a.

Referring to FIG. 50, anisotropic etching such as RIE (reactive ion etching) is performed to reach the interior of the substrate 2001 for forming grooves 2008 of 0.8 μm in depth, the mask 2007a is removed, and thereafter $SiO_2$ or the like is deposited on the overall surface by CVD (chemical vapor deposition) for forming a second element isolation insulating film 2009.

Referring to FIG. 51, the deposited second element isolation insulating film 2009 is etched back, for exposing a surface of the patterned second semiconductor material film 2006 and leaving the second element isolation insulating film 2009 only in the grooves 2008. Thereafter a mask 2007b is formed to cover a memory transistor region through a photoresist material.

Referring to FIG. 52, parts of the patterned second semiconductor material film 2006 and the semiconductor material insulating film 2005 are successively selectively removed from a peripheral transistor region, a surface of the patterned first semiconductor material film 2004 is exposed, and the mask 2007b is removed. At this point of time, the surfaces of the first and second semiconductor material films 2004 and 2006 are exposed in the peripheral transistor region and the memory transistor region respectively. Thereafter a conductive material film 2010 which can be in ohmic contact with the first and second semiconductor material films 2004 and 2006 is formed. Consequently, electrode material films for defining a control gate electrode and a peripheral transistor gate electrode later are brought into double structures.

Referring to FIG. 53, the first and second semiconductor material films 2004 and 2006 and the conductive material film 2010 are patterned by a well-known technique for forming a peripheral transistor gate electrode 2011, a control gate electrode 2012 and a floating gate electrode 2013. Then, impurity diffusion layers 2014 for defining source and drain regions are formed, and an interlayer insulating film 2015 is deposited on the overall surface. Contact holes 2016 are provided in the interlayer insulating film 2015, and thereafter aluminum is deposited and patterned for forming metal wires 2017. The nonvolatile semiconductor memory device is completed through the aforementioned series of steps.

In recent years, however, a higher operating speed is required for the nonvolatile semiconductor memory device. In the aforementioned conventional structure, an electric field between the silicon substrate and the floating gate electrode cannot be strengthened and it is difficult to simultaneously inject a large quantity of electrons into the floating gate electrode in writing unless a voltage applied to the control voltage is increased. Thus, it is impossible to increase the operating speed while keeping the voltage applied to the control gate electrode.

In the conventional nonvolatile semiconductor memory device, further, the grooves for isolation are so deep that the widths thereof must be increased for completely filling up the same with the insulating film. Thus, further refinement cannot be attained.

SUMMARY OF THE INVENTION

The present invention has been proposed in order to solve the aforementioned problems, and an object thereof is to provide a nonvolatile semiconductor memory device whose operating speed can be increased and a method of fabricating the same.

Another object of the present invention is to provide a nonvolatile semiconductor memory device which can be further refined and a method of fabricating the same.

The nonvolatile semiconductor memory device according to the present invention comprises a memory cell array including a plurality of nonvolatile transistors for storing information formed on a semiconductor substrate having a major surface, and a peripheral circuit including a plurality of semiconductor elements for controlling operations of the memory cell array.

Each of the plurality of nonvolatile transistors comprises a floating gate electrode and a control gate electrode. The floating gate electrode is formed on the semiconductor substrate through an insulating film, and has an upper surface. The control gate electrode is formed on the floating gate electrode through an insulating film, and continuously extends in a prescribed arrangement direction of the memory cell array.

The memory cell array includes a trench and an insulating layer. The trench electrically isolates the plurality of nonvolatile transistors, which are adjacent to each other along the longitudinal direction of the control electrodes, formed on the major surface of the semiconductor substrate from each other. The insulating layer fills up the trench, and its upper surface projects upward beyond the major surface of the semiconductor substrate. The upper surface of the insulating layer is positioned at a height between upper and lower surfaces of the floating gate electrodes. The control gate electrodes are formed through the insulating film to extend along the overall upper surfaces and portions close to upper ends of side surfaces of the floating gate electrodes and the upper surface of the insulating layer. The plurality of semiconductor elements are electrically isolated from each other by a LOCOS oxide film.

In the nonvolatile semiconductor memory device having the aforementioned structure, the plurality of nonvolatile transistors forming the memory cell array are isolated from each other by the trench and the semiconductor elements of the peripheral circuit are isolated from each other by the LOCOS oxide film, whereby refinement of the memory cell array and improvement in voltage resistance of the peripheral circuit can be simultaneously attained.

Each control gate electrode continuously extends along the overall upper surface and the portion close to the upper ends of the side surfaces of each floating gate electrode and the upper surface of the insulating layer, whereby the floating gate electrode and the control gate electrode are opposed to each other also in the vicinity of the upper ends of both side surfaces of the floating gate. Thus, the opposition areas of the floating gate electrode and the control gate electrode are increased to increase the capacitance therebetween, whereby the following effect is attained.

Assuming that $C_A$ and $V_A$ represent the capacitance and the potential difference between the control gate electrode and the floating gate electrode respectively, $C_B$ and $V_B$ represent those between the floating gate electrode and the substrate respectively and Q represents the quantity of charges stored in the floating gate electrode, the following relation holds between these values:

$$Q = C_A V_A = C_B V_B \quad (A)$$

When the potential difference VA and the capacitance $C_B$ are at constant levels, the potential difference $V_B$ is increased following increase of the capacitance $C_A$, whereby an electric field around a channel region is increased. Consequently, channel hot electron injection can be efficiently caused while keeping the potential difference $V_B$, and the speed of a write operation can be increased.

Further, the opposition areas of the floating gate electrode and the control gate electrode are increased, whereby the floating gate electrode readily stores charges. Consequently, it is possible to reduce a voltage applied to the control gate electrode for storing charges in the floating gate electrode similarly to the prior art.

A bottom surface of the LOCOS oxide film is preferably deeper than that of the trench as viewed from the major surface of the semiconductor substrate. In general, voltage resistance required to a memory region is lower than that of the peripheral region, and hence the trench can be relatively reduced in depth. Consequently, the trench is readily filled up with the insulating layer, whereby its opening area can be reduced. Thus, the nonvolatile semiconductor memory device can be implemented with higher density of integration, and the plurality of nonvolatile transistors are reliably electrically isolated from each other. On the other hand, the LOCOS oxide film is kept in a depth similar to that of the prior art, whereby general voltage resistance is not deteriorated in the peripheral region.

A part of the semiconductor substrate which is in contact with the bottom surface of the trench is preferably provided with a channel stopper. In this case, the channel stopper formed on the bottom portion of the trench further reliably electrically isolates the plurality of nonvolatile transistors from each other.

A method of fabricating a nonvolatile semiconductor memory device according to an aspect of the present invention is adapted to fabricate a nonvolatile semiconductor memory device comprising a memory cell array including a plurality of nonvolatile transistors for storing information and a peripheral circuit including a plurality of semiconductor elements for controlling operations of the memory cell array, and comprises the steps of:

preparing a semiconductor substrate including a major surface, a memory region to be provided with the memory cell array, and a peripheral region to be provided with the peripheral circuit;

forming a first conductive layer covering the memory region on the major surface of the semiconductor substrate through a first insulating film;

removing prescribed regions of the first conductive layer and the semiconductor substrate up to a prescribed depth from the major surface of the semiconductor substrate, thereby forming a plurality of strip conductive layers for defining floating gate electrodes extending along a prescribed arrangement direction of the memory cell array substantially in parallel with each other and a trench extending on the major surface of the semiconductor substrate in a region between the plurality of strip conductive layers;

forming an insulating layer, filling up each trench, having an upper end surface positioned at a height between upper and lower surfaces of the floating gate electrodes;

forming a second conductive layer, covering the memory region through a second insulating film, for defining control gate electrodes to be along the overall upper surfaces of the strip conductive layers, portions close to upper ends of side surfaces of the strip conductive layers, and an upper surface of the insulating layer;

performing prescribed patterning on the second conductive layer, the second insulating film and the strip conductive layers thereby forming the individual floating gate electrodes forming the memory cell array while forming a plurality of substantially parallel control gate electrodes to continuously extend along an arrangement direction of the memory cell array perpendicular to the longitudinal direction of the plurality of strip conductive layers; and forming a LOCOS oxide film for electrically isolating the plurality of semiconductor elements from each other on the peripheral region.

In the method of fabricating a nonvolatile semiconductor memory device comprising such steps, the trench is formed before formation of the control gate electrodes, whereby the control gate electrodes are not etched in formation of the trench. Consequently, the etching depth is reduced as compared with the case of etching the control gate electrodes for forming the trench, whereby the trench is easy to form.

The step of forming the trench preferably includes an operation of forming the trench so that its bottom surface is shallower than that of the LOCOS oxide film as viewed from the major surface of the semiconductor substrate. The voltage resistance required to the memory region provided with the trench is generally lower than that of the peripheral region provided with the LOCOS oxide film, and hence the trench is preferably formed as shallow as possible in a range not deteriorating the voltage resistance, to be readily filled up with the insulating layer. When the trench is thus relatively shallowly formed, a constant aspect ratio can be maintained even if its opening area is reduced, and the memory region can be readily refined. Consequently, the plurality of nonvolatile transistors are reliably electrically isolated from each other. On the other hand, the LOCOS oxide film is relatively deep, and hence the voltage resistance is not reduced in the peripheral region.

The method preferably further includes a step of injecting impurity ions into the bottom surface of the trench thereby forming a channel stopper on a part of the semiconductor substrate which is in contact with the bottom surface of the trench. In this case, the plurality of nonvolatile transistors are further reliably electrically isolated from each other by the channel stopper formed on the bottom portion of the trench.

A method of fabricating a nonvolatile semiconductor memory device according to another aspect of the present invention is adapted to fabricate a nonvolatile semiconductor memory device comprising a memory cell array including a plurality of nonvolatile transistors for storing information and a peripheral circuit including a plurality of semiconductor elements for controlling operations of the memory cell array, and comprises the steps of:

preparing a semiconductor substrate including a major surface, a memory region to be provided with the memory cell array, and a peripheral region to be provided with the peripheral circuit;

removing prescribed regions of the semiconductor substrate up to a prescribed depth from its major surface thereby forming a plurality of trenches extending along a prescribed arrangement direction of the memory cell array substantially in parallel with each other;

forming a plurality of insulating layers to fill up respective ones of the trenches and to have upper surfaces positioned upward beyond the major surface of the semiconductor substrate;

forming a plurality of strip conductive layer for defining a floating gate electrode on the major surface of the semiconductor substrate in a region between the respective ones of the plurality of insulating layers through a first insulating film to have an upper surface positioned upward beyond those of the insulating layers;

forming a conductive layer, for defining a control gate electrode, covering the memory region through a second insulating film to be along the overall upper surface of the strip conductive layer, a portion close to the upper end of a side surface of the strip conductive layer and the upper surfaces of the insulating layers;

performing prescribed patterning on the conductive layer, the second insulating film and the strip conductive layer for forming each floating gate electrode forming the memory cell array while forming a plurality of substantially parallel control gate electrodes to continuously extend along an arrangement direction of the memory cell array perpendicular to the longitudinal direction of the strip conductive layer; and forming a LOCOS oxide film for electrically isolating the plurality of semiconductor elements from each other on the peripheral region.

In the method of fabricating a nonvolatile semiconductor memory device comprising such steps, the trenches are formed before formation of the control gate electrodes, whereby the control gate electrodes are not etched in formation of the trenches. Thus, the etching depth is reduced and hence the trenches are easy to form.

The step of forming the trenches preferably includes an operation of forming the trenches so that bottom surfaces thereof are shallower than that of the LOCOS oxide film as viewed from the major surface of the semiconductor substrate.

The voltage resistance required to the memory region is generally lower than that of the peripheral region, and hence the trenches can be relatively reduced in depth. Therefore, the trenches are readily filled up with the insulating layer even if opening areas thereof are reduced, whereby the nonvolatile semiconductor memory device can be implemented with higher density of integration, and the plurality of nonvolatile transistors are reliably electrically isolated from each other by the trenches. On the other hand, the LOCOS oxide film is formed to be relatively deep, whereby the voltage resistance of the peripheral region is not deteriorated.

The method preferably further includes a step of injecting impurity ions into bottom surfaces of the trenches thereby forming channel stoppers on parts of the semiconductor substrate which are in contact with the bottom surfaces of the trenches. In this case, the plurality of nonvolatile transistors are further reliably electrically isolated from each other by the channel stoppers.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a cross section taken along line A—A in FIG. 1.

FIG. 2B is a cross section taken along line B—B is FIG. 1.

FIG. 2C is a cross section taken along line C—C in FIG. 1.

FIGS. 3A to 3C are sectional views showing first step of the method of fabricating the nonvolatile semiconductor memory device shown in FIGS. 2A to 2C.

FIGS. 4A to 4C are sectional views showing second step of the method of fabricating the nonvolatile semiconductor memory device shown in FIGS. 2A to 2C.

FIGS. 5A to 5C are sectional views showing third step of the method of fabricating the nonvolatile semiconductor memory device shown in FIGS. 2A to 2C.

FIGS. 6A to 6C are sectional views showing fourth step of the method of fabricating the nonvolatile semiconductor memory device shown in FIGS. 2A to 2C.

FIGS. 7A to 7C are sectional views showing fifth step of the method of fabricating the nonvolatile semiconductor memory device shown in FIGS. 2A to 2C.

FIGS. 8A to 8C are sectional views showing sixth step of the method of fabricating the nonvolatile semiconductor memory device shown in FIGS. 2A to 2C.

FIGS. 9A to 9C are sectional views showing seventh step of the method of fabricating the nonvolatile semiconductor memory device shown in FIGS. 2A to 2C.

FIGS. 10A to 10C are sectional views showing eighth step of the method of fabricating the nonvolatile semiconductor memory device shown in FIGS. 2A to 2C.

Figs. 11A to 11C are sectional views showing ninth step of the method of fabricating the nonvolatile semiconductor memory device shown in FIGS. 2A to 2C.

FIGS. 12A to 12C are sectional views showing tenth step of the method of fabricating the nonvolatile semiconductor memory device shown in FIGS. 2A to 2C.

FIGS. 13A to 13C are sectional views showing eleventh step of the method of fabricating the nonvolatile semiconductor memory device shown in FIGS. 2A to 2C.

FIGS. 14A to 14C are sectional views showing twelfth step of the method of fabricating the nonvolatile semiconductor memory device shown in FIGS. 2A to 2C.

FIGS. 15A to 15C are sectional views showing thirteenth step of the method of fabricating the nonvolatile semiconductor memory device shown in FIGS. 2A to 2C.

FIGS. 16A to 16C are sectional views showing fourteenth step of the method of fabricating the nonvolatile semiconductor memory device shown in FIGS. 2A to 2C.

FIGS. 17A to 17C are sectional views showing fifteenth step of the method of fabricating the nonvolatile semiconductor memory device shown in FIGS. 2A to 2C.

FIGS. 18A to 18C are sectional views showing sixteenth step of the method of fabricating the nonvolatile semiconductor memory device shown in FIGS. 2A to 2C.

FIGS. 19A to 19C are sectional views showing seventeenth step of the method of fabricating the nonvolatile semiconductor memory device shown in FIGS. 2A to 2C.

FIGS. 20A to 20C are sectional views showing eighteenth step of the method of fabricating the nonvolatile semiconductor memory device shown in FIGS. 2A to 2C.

FIGS. 23A to 23C are sectional views showing twenty-first step of the method of fabricating the nonvolatile semiconductor memory device shown in FIGS. 2A to 2C.

FIGS. 24A to 24C are sectional views showing twenty-second step of the method of fabricating the nonvolatile semiconductor memory device shown in FIGS. 2A to 2C.

FIGS. 27A to 27C are sectional views showing first step of a method of fabricating a nonvolatile semiconductor memory device according to an embodiment 2 of the present invention;

FIGS. 28A to 28C are sectional views showing second step of a method of fabricating a nonvolatile semiconductor memory device according to an embodiment 2 of the present invention;

FIGS. 29A to 29C are sectional views showing third step of a method of fabricating a nonvolatile semiconductor memory device according to an embodiment 2 of the present invention;

FIGS. 30A to 30C are sectional views showing fourth step of a method of fabricating a nonvolatile semiconductor memory device according to an embodiment 2 of the present invention;

FIGS. 31A to 31C are sectional views showing fifth step of a method of fabricating a nonvolatile semiconductor memory device according to an embodiment 2 of the present invention;

FIGS. 32A to 32C are sectional views showing sixth step of a method of fabricating a nonvolatile semiconductor memory device according to an embodiment 2 of the present invention;

FIGS. 35A to 35C are sectional views showing a nonvolatile semiconductor memory device according to an embodiment 3 of the present invention;

DESCRIPTION OF THE PREFERRED EMBODIMENTS

Embodiments of the present invention are now described with reference to the drawings.
(Embodiment 1)

Figure 1:
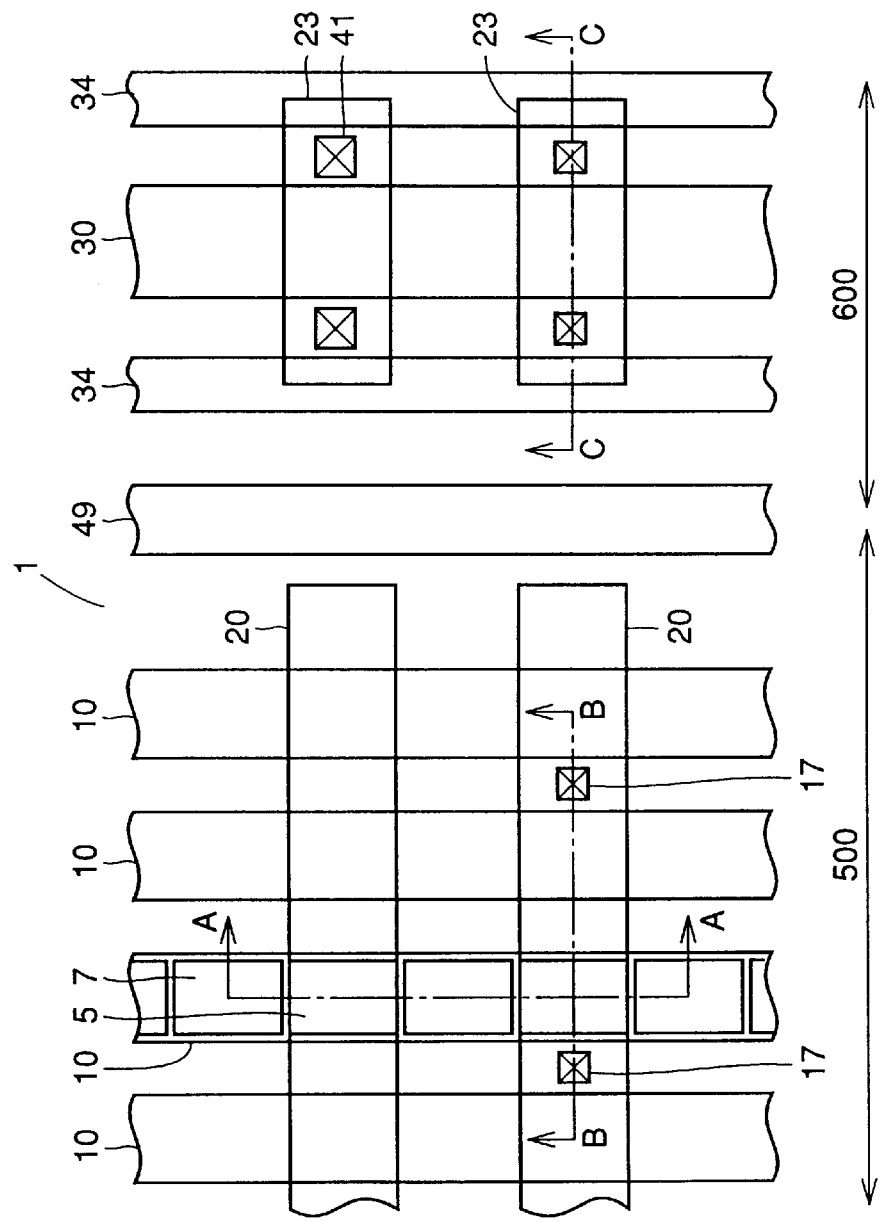
FIG. 1 is a plan view showing a nonvolatile semiconductor memory device according to an embodiment 1 of the present invention.

Referring to FIGS. 1 to 2C, memory transistors of a flash EEPROM have n-type impurity regions 13*a* and 13*b* serving as drain regions, n-type impurity regions 14 serving as source regions, silicon oxide films 4, floating gate electrodes 7, ONO films 8, silicon oxide films 9, and control gate electrodes 10 in a memory region 500.

The impurity regions 13*a*, 13*b* and 14 are formed on a surface of a p-type silicon substrate 1 at prescribed intervals. The floating gate electrodes 7 are formed on regions held between the impurity regions 13*a*, 13*b* and 14 through the silicon oxide films 4. The control gate electrodes 10 are formed to extend on the floating gate electrodes 7 through the ONO films 8 consisting of three types of.layers including silicon oxide films, silicon nitride films and silicon oxide films and the silicon oxide films 9.

A bottom n well 2 and a p well 3 which is in contact with the bottom n well 2 are formed on the silicon substrate 1. Trenches 5 are formed between the floating gate electrodes 7 arranged along a prescribed direction, and silicon oxide films 6 as formed to fill up the trenches 5. Upper end surfaces of the silicon oxide films 7 are positioned between upper and lower surfaces of the floating gate electrodes 7. The ONO films 8, the silicon oxide films 9, the control gate electrodes 10 and TEOS (tetraethyl orthosilicate) oxide films 11 are formed on the silicon oxide films 6 and the floating gate electrodes 7.

A p-type pocket region 15 is formed to enclose each impurity region 14. Side wall oxide films 12 are formed on side walls of the floating gate electrodes 7, the ONO films 8, the silicon oxide films 9, the control gate electrodes 10 and the TEOS oxide films 11.

An interlayer insulating film 16 is formed to cover the memory transistors. Contact holes 17 reaching the impurity regions 13*a* and 13*b* are formed in parts of the interlayer insulating film 16. Doped polysilicon layers 20*a* are formed to fill up the contact holes 17 and to cover the interlayer insulating film 16.

Bit lines 20 consist of the doped polysilicon layers 20*a* which are in contact with the interlayer insulating film 16 and tungsten silicide layers 20*b*. An interlayer insulating film 21 is formed to cover the interlayer insulating film 16 and the bit lines 20. A silicon oxide film 22 is formed on the interlayer insulating film 21, and aluminum wires 23 are formed to be buried in the silicon oxide film 22. A smooth coating film 24 is formed to be in contact with the silicon oxide film 22 and the aluminum wires 23, and an aluminum wire 25 is further formed on the smooth coating film 24.

In a peripheral region 600, on the other hand, a LOCOS oxide film 30 is formed on the silicon substrate 1. A p well 31 and an n well 32 are formed along the LOCOS oxide film 30.

A transistor having a gate electrode 34, a silicon oxide film 33, and n-type low- and high-concentration impurity regions 37 and 38 serving as source/drain regions is formed on the p well 31. On the other hand, a transistor having a gate electrode 34, a silicon oxide film 33 and p-type low- and high-concentration impurity regions 39 and 40 serving as source/drain regions is formed on the n well 32. Silicon oxide films 35 are formed on the gate electrodes 34, and side wall oxide films 36 are formed on side walls of the gate electrodes 34 and the silicon oxide films 35.

The interlayer insulating films 16 and 21 are formed to cover the transistors. Contact holes 41 reaching the silicon substrate 1 are formed in the interlayer insulating films 16 and 21. Plugs 42 are formed to fill up the contact holes 41. An aluminum wire 23 is buried in the silicon oxide film 22 to be in contact with the interlayer insulating film 21 and the plugs 42. The smooth coating film 24 is formed on the silicon oxide film 22, and an aluminum wire 43 is formed to be buried in the smooth coating film 24. The aluminum wire 25 which is in contact with the aluminum wire 43 is formed on the smooth coating film 24.

As viewed from the surface of the silicon substrate 1, the depth ($D_1$) of bottom surfaces of the trenches 5 is 3000 Å, the height of surfaces of the silicon oxide films 6 is 300 Å, the height of upper surfaces of the floating gate electrodes 7 is 1000 Å, and the depth ($D_2$) of a bottom surface of the LOCOS oxide film 30 is 5000 Å.

The memory region 500 provided with the memory transistors is electrically isolated from the peripheral region 600 provided with the transistors having the gate electrodes 34 by a LOCOS oxide film 49.

A method of fabricating such a nonvolatile semiconductor memory device is now described. Referring to FIGS. 3A to 3C, a silicon oxide film 51 of about 300 Å in thickness is formed on a (100) plane of the p-type silicon substrate 1. A doped polysilicon layer 52 of about 1000 Å in thickness is formed on the silicon oxide film 51. A silicon nitride film 53 of about 1000 Å in thickness is formed on the doped polysilicon layer 52. A resist material is applied to cover the silicon nitride film 53, and subjected to prescribed patterning thereby forming a resist pattern 54. The silicon nitride film 53 and the doped polysilicon layer 52 are patterned in prescribed shapes with $CF_4$ gas along the resist pattern 54.

Referring to FIGS. 4A to 4C, the LOCOS oxide film 30 is formed by a LOCOS method. As viewed from the surface of the silicon substrate 1, the depth of the bottom surface of the LOCOS oxide film 30 is 4000 Å, and the height of the upper surface of the LOCOS oxide film 30 is 3000 Å. The doped polysilicon layer 52 and the silicon nitride film 53 are removed by $CF_4$ gas. The overall silicon substrate 1 is covered with a resist material, which in turn is patterned in a prescribed shape thereby forming a resist pattern 56. Phosphorus is ion-implanted into the silicon substrate 1 through the resist pattern 56 serving as a mask with injection energy of 3 MeV at an injection rate of $1.0 \times 10^{13}/cm^2$ as shown by arrows 57, thereby forming the bottom n well 2 in the silicon substrate 1. Thereafter the resist pattern 56 is removed.

Referring to FIGS. 5A to 5C, a resist material is applied to the silicon substrate 1 and patterned in a prescribed shape for forming a resist pattern 59. Phosphorus is injected into the silicon substrate 1 through the resist pattern 59 serving as a mask with injection energy of 1.2 MeV at an injection rate of $1.0 \times 10^{13}/cm^2$ as shown by arrows 60, thereby forming the n well 32. Further, phosphorus is ion-implanted into the silicon substrate 1 through the resist pattern 59 serving as a mask with injection energy of 700 keV at an injection rate of $3.0 \times 10^{12}/cm^2$, for forming a channel cut region (not shown). In addition, boron is ion-implanted into the silicon substrate 1 through the resist pattern 59 serving as a mask with injection energy of 20 keV at an injection rate of $1.5 \times 10^{12}/cm^2$, for forming a counter doped region (not shown). The resist pattern 59 is removed after these operations.

Referring to FIGS. 6A to 6C, a resist material is applied to cover the silicon substrate 1 and patterned in a prescribed shape for forming a resist pattern 61. Boron is ion-implanted into the silicon substrate 1 through the resist pattern 61 serving as a mask with injection energy of 700 keV at an injection rate of $1.0 \times 10^{13}/cm^2$ as shown by arrows 62, thereby forming the p wells 3 and 31. Further, boron is ion-implanted into the silicon substrate 1 with injection energy of 270 keV at an injection rate of $3.5 \times 10^{12}/cm^2$, for forming a channel cut region (not shown). In addition, boron is ion-implanted into the silicon substrate 1 through the resist pattern 61 serving as a mask with injection energy of 50 keV at an injection rate of $1.2 \times 10^{12}/cm^2$, for forming a channel doped region (not shown). The resist pattern 61 is thereafter removed.

Referring to FIGS. 7A to 7C, the overall surface of the silicon oxide film 51 provided on the silicon substrate 1 is etched back to expose the surface of the silicon substrate 1.

Referring to FIGS. 8A to 8C, a silicon oxide film 63 of 100 Å in thickness and a doped polysilicon layer 64 of 2000 Å in thickness are formed on the surface of the silicon substrate 1, and a resist material is applied onto the doped polysilicon layer 64. This resist material is patterned in a prescribed shape for forming a resist pattern 65. The doped polysilicon layer 64, the silicon oxide film 63 and the silicon substrate 1 are etched by $CF_4$ gas through the resist pattern 65 serving as a mask, thereby forming the trenches 5 whose depth is 3000 Å as viewed from the surface of the silicon substrate 1. Thereafter the resist pattern 65 is removed.

Referring to FIGS. 9A to 9C, a silicon oxide film is formed to cover the overall surface of the silicon substrate 1, and the overall surface of this silicon oxide film is etched back for forming the silicon oxide films 6 whose upper surfaces are located on positions of a depth of 300 Å as viewed from the upper surface of the doped polysilicon layer 64.

Referring to FIGS. 10A to 10C, an ONO film 66 consisting of three layers including an oxide film (50 Å in thickness), a nitride film (80 Å in thickness) and an oxide film (115Å in thickness) is formed to cover the doped polysilicon layer 64 and the silicon oxide films 6, and a resist material is applied to cover the overall ONO film 66. The resist material is subjected to prescribed patterning, thereby forming a resist pattern 67.

Referring to FIGS. 11A to 11C, parts the ONO film 66 and the doped polysilicon layer 64 are removed from the region 400 to be provided with a peripheral circuit by etching with $CF_4$ gas through the resist pattern 67 serving as a mask. Thereafter the resist pattern 67 is removed.

Referring to FIGS. 12A to 12C, a silicon oxide film of 115Å in thickness, a doped polysilicon layer of 1000Å in thickness, a tungsten silicide layer of 1000Å in thickness, and a TEOS oxide film of 2500Å in thickness are formed to cover the silicon substrate 1. A resist material is applied to cover the TEOS oxide film, and patterned in a prescribed shape for forming a resist pattern 69. The TEOS oxide film, the tungsten silicide layer, the doped polysilicon layer and the silicon oxide film are etched by Cl gas through the resist pattern 69 serving as a mask, thereby forming the TEOS oxide films 11, the control gate electrodes 10 and the silicon oxide films 9 in the region 300 provided with the memory transistors while forming the silicon oxide films 35, the gate electrodes 34 and the silicon oxide films 33 in the region 400. Thereafter the resist pattern 69 is removed.

Referring to FIGS. 13A to 13C, the overall silicon substrate 1 is covered with a resist material, which in turn is patterned in a prescribed shape for forming a resist pattern 70. The ONO film 66, the doped polysilicon layer 64 and the silicon oxide film 63 are etched along the resist pattern 70, thereby forming the ONO films 8, the floating gate electrodes 7 and the silicon oxide films 4. Thereafter the resist pattern 70 is removed.

Referring to FIGS. 14A to 14C, a resist material is applied to the overall surface of the silicon substrate 1 and patterned in a prescribed shape thereby forming a resist pattern 72. Phosphorus is ion-implanted into the region 300 of the silicon substrate 1 with injection energy of 50 keV at an injection rate of $7 \times 10^{14}/cm^2$ as shown by arrows 71 in the region 300 while arsenic is ion-implanted with injection energy of 35 keV at an injection rate of $3.0 \times 10^{15}/cm^2$, for forming the n-type impurity regions 13a and 13b serving as drain regions of the memory transistors. Thereafter the resist pattern 72 is removed.

Referring to FIGS. 15A to 15C, a resist material is applied to the overall surface of the silicon substrate 1 and patterned in a prescribed shape thereby forming a resist pattern 99. Arsenic is ion-implanted into the region 300 of the silicon substrate 1 with injection energy of 35 keV at an injection rate of $3.0 \times 10^{15}/cm^2$ as shown by arrows 73 through the resist pattern 99 serving as a mask, for forming the n-type impurity region 14 serving as a source region of each memory transistor. Further, boron is ion-implanted into the silicon substrate 1 with injection energy of 50 keV at an injection rate of $1.0 \times 10^{13}/cm^2$ through the resist pattern 99 serving as a mask, for forming the pocket region 15. Thereafter the resist pattern 99 is removed.

Referring to FIGS. 16A to 16C, a resist material is applied to the overall surface of the silicon substrate 1 and patterned in a prescribed shape, thereby forming a resist pattern 74. Phosphorus is ion-implanted into the region 400 of the silicon substrate 1 with injection energy of 50 keV at an injection rate of $4.0 \times 10^{13}/cm^2$ as shown by arrows 75 for forming the n-type low-concentration impurity region 37 for a source/drain region of a MOS (metal oxide semiconductor) transistor of the peripheral circuit. Thereafter the resist pattern 74 is removed.

Referring to FIGS. 17A to 17C, a resist material is applied to cover the overall silicon substrate 1 and patterned in a prescribed shape for forming a resist pattern 76. Boron is ion-implanted into the region 400 of the silicon substrate 1 with injection energy of 50 keV at an injection rate of $1.5 \times 10^{13}/cm^2$ as shown by arrows 77 for forming the p-type low-concentration impurity region 39 for serving as a source/drain region of another MOS transistor of the peripheral circuit. Thereafter the resist pattern 76 is removed.

Referring to FIGS. 18A to 18C, a silicon oxide film of 2500 Å in thickness is formed by CVD to cover the overall surface of the silicon substrate 1, and anisotropically etched thereby forming the side wall oxide films 12 and 36.

Referring to FIGS. 19A to 19C, a resist material is applied to the overall surface of the silicon substrate 1 and patterned in a prescribed shape, thereby forming a resist pattern 78 on a part of the region 400 to be provided with a PMOS transistor. Arsenic is ion-implanted into the silicon substrate 1 with injection energy of 35 keV at an injection rate of $4.0 \times 10^{15}/cm^2$ as shown by arrows 79 through the resist pattern 78 serving as a mask, for forming the n-type high-concentration impurity region 38 for serving as a source/drain region of an NMOS transistor of the peripheral circuit. Arsenic is injected also into the impurity regions 13a, 13b and 14. Thereafter the resist pattern 78 is removed.

Referring to FIGS. 20A to 20C, a resist material is applied to the overall surface of the silicon substrate 1 and patterned in a prescribed shape, thereby forming a resist pattern 80 on a part of the region 400 to be provided with the NMOS transistor. $BF_2$ is injected into the silicon substrate 1 with injection energy of 20 keV at an injection rate of $2.0 \times 10^{15}/cm^2$ as shown by arrows 81 through the resist pattern 80 serving as a mask, for forming the p-type high-concentration impurity region 40 serving as a source/drain region of the PMOS transistor of the peripheral circuit. Thereafter the resist pattern 80 is removed.

Figure 21A:
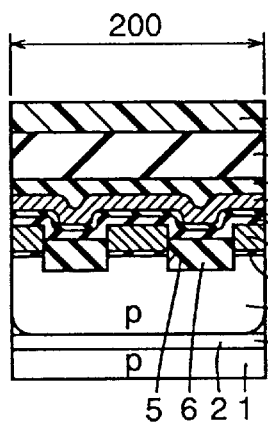
FIGS. 21A to 21C are sectional views showing nineteenth step of the method of fabricating the nonvolatile semiconductor memory device shown in FIGS. 2A to 2C.
Figure 21B:
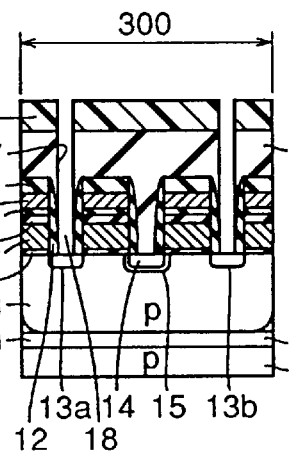
Figure 21C:
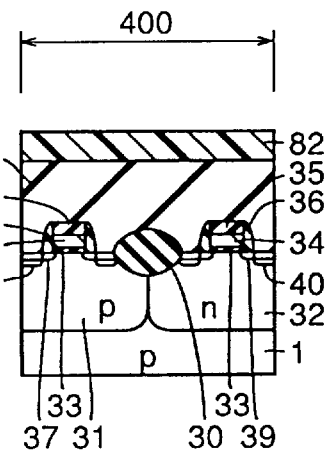

Referring to FIGS. 21A to 21C, the interlayer insulating film 16 of 3000 Å in thickness consisting of a TEOS oxide film is formed to cover the overall surface of the silicon substrate 1. A resist material is applied onto the interlayer insulating film 16 and patterned in a prescribed shape, thereby forming a resist pattern 82. Parts of the interlayer insulating film 16 are removed by CF gas along the resist pattern 82, thereby forming the contact holes 17 having an opening diameter of 0.5 μm and reaching the n-type impurity regions 13a and 13b. Thereafter the resist pattern 82 is removed.

Figure 22A:
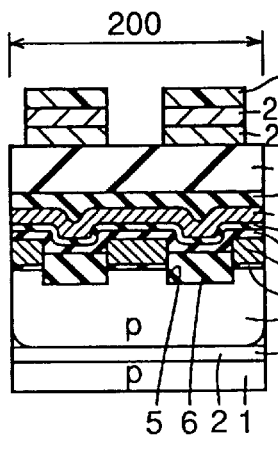
FIGS. 22A to 22C are sectional views showing twentieth step of the method of fabricating the nonvolatile semiconductor memory device shown in FIGS. 2A to 2C.
Figure 22B:
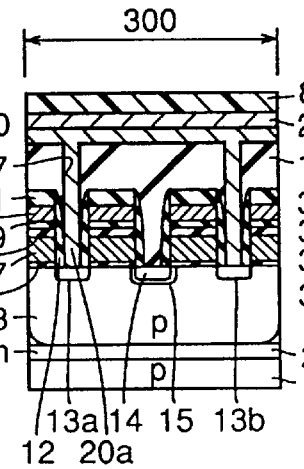
Figure 22C:
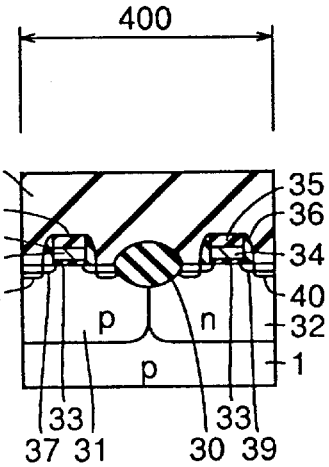

Referring to FIGS. 22A to 22C, a doped polysilicon layer is deposited to fill up the contact holes 17. A tungsten silicide layer of 1000 Å in thickness is formed to cover the doped polysilicon layer. A resist material is applied onto the tungsten silicide layer and patterned in a prescribed shape, thereby forming a resist pattern 83. The doped polysilicon layer and the tungsten silicide layer are patterned with HBr gas along the resist pattern 83, thereby forming the bit lines 20 consisting of the tungsten silicide layers 20b and the doped polysilicon layers 20a. Referring to FIGS. 23A to 23C, the interlayer insulating film 21 of 9000 Å in thickness consisting of a TEOS oxide film is deposited to cover the interlayer insulating film 16. A resist material is applied onto the interlayer insulating film 21 and patterned in a prescribed shape, thereby forming a resist pattern 84. Parts of the interlayer insulating films 16 and 21 are removed in the region 400 by CF gas through the resist pattern 84 serving as a mask, thereby forming the contact holes 41 having an opening diameter of 0.5 μm and reaching the silicon substrate 1. Thereafter the resist pattern 83 is removed.

Referring to FIGS. 24A to 24C, a tungsten layer is deposited to fill up the contact holes 41. This tungsten layer is etched back for forming the plugs 42. An aluminum alloy layer of 4000 Å in thickness is formed on the interlayer insulating film 21 by sputtering. A resist material is applied onto the aluminum alloy layer and patterned in a prescribed shape, thereby forming a resist pattern 85. The aluminum alloy layer is patterned by Cl gas through the resist pattern 85 serving as a mask, thereby forming the aluminum wires 23. Thereafter the resist pattern 85 is removed.

Figures 25A, 25B, 25C:
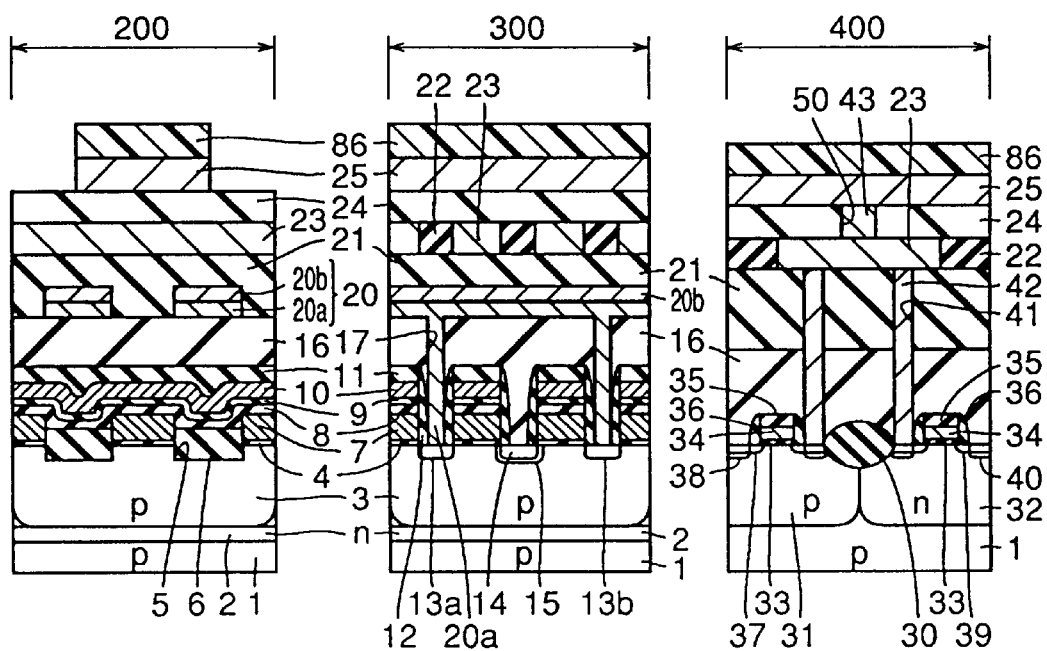
FIGS. 25A to 25C are sectional views showing twenty-third step of the method of fabricating the nonvolatile semiconductor memory device shown in FIGS. 2A to 2C.

Referring to FIGS. 25A to 25C, a silicon oxide film of 1500 Å in thickness is deposited to cover the overall interlayer insulating film 21, for forming the silicon oxide films 22. The smooth coating film 43 of 7000 Å in thickness consisting of an SOG (spin on glass) film and a TEOS oxide film is formed on the silicon oxide films 22 and the aluminum wires 23. A resist material is applied onto the smooth coating film 43 and patterned in a prescribed shape thereby forming a resist pattern. The smooth coating film 43 is patterned through the resist pattern serving as a mask, thereby forming a through hole 50 having an opening diameter of 0.65 μm. An aluminum alloy layer of 8000 Å in thickness is deposited to fill up the through hole 50 and cover the smooth coating film 43. A resist material is applied onto the aluminum alloy layer and patterned in a prescribed shape, thereby forming a resist pattern 86. The aluminum alloy layer is patterned along the resist pattern 86, thereby forming the aluminum wire 25. Finally, the resist pattern 86 is removed, thereby completing the nonvolatile semiconductor memory device shown in FIG. 2.

In the aforementioned nonvolatile semiconductor memory device according to the present invention, the memory transistors are insulated by the trenches 5 and the silicon oxide films 6 buried therein, whereby the memory cell array can be readily refined. In the peripheral region, the transistors are isolated from each other by the LOCOS oxide film 30, whereby the voltage resistance can be maintained.

Figure 26A:
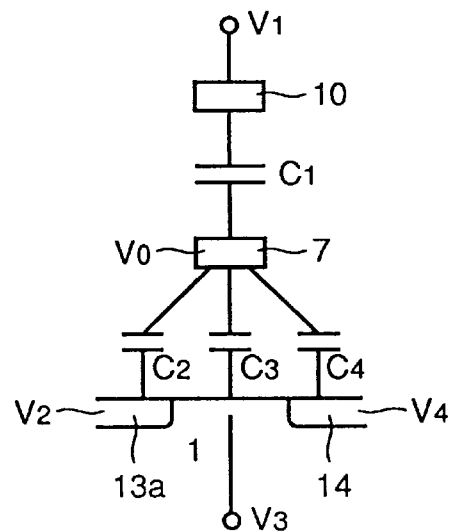
FIG. 26A is an equivalent circuit diagram of the nonvolatile semiconductor memory device obtained according to the present invention.

In regions close to upper ends of both side surfaces of the floating gate electrodes 7, i.e., regions denoted by symbol A in FIGS. 2A to 2C, the floating gate electrodes 7 are so opposed to the control gate electrodes 10 that opposition areas therebetween are increased. Consequently, capacitances between the floating gate electrodes 7 and the control gate electrodes 10 are increased. As shown in FIG. 26A, each floating gate electrode 7 and each control gate electrode 10 can be regarded as forming a capacitor having a capacitance $C_1$. Further, each floating gate electrode 7 can be regarded as forming capacitors having capacitances $C_2$, $C_3$ and $C_4$ with the impurity region 13a, the silicon substrate 1 and the impurity region 14 respectively. Assuming that $V_0$, $V_1$, $V_2$, $V_3$ and $V_4$ represent the potentials of the floating gate electrode 7, the control gate electrode 10, the impurity region 13a, the silicon substrate 1 and the impurity region 14 respectively, the following relational expression holds therebetween:

$$V_0 = \frac{C_1}{C_0}(V_1 - \Delta V) + \frac{C_2}{C_0}V_2 + \frac{C_3}{C_0}V_3 + \frac{C_4}{C_0}V_4 \quad \text{(B)}$$

$$(C_0 = C_1 + C_2 + C_3 + C_4)$$

where $\Delta V$ represents the amount of change of a threshold voltage $V_{TH}$ of the memory transistor caused by charges stored in the floating gate electrode 7.

In a channel hot electron injection write operation of a NOR type flash memory, for example, the potentials $V_1$, $V_4$ (=$V_3$) and $V_2$ are equal to 10 V, 0 V and 6 V respectively, and hence the potential $V_0$ is calculated as follows:

$$V_0 = \frac{C_1}{C_0}(10 - \Delta V) + \frac{C_2}{C_0} \cdot 6 \qquad (C)$$

The amount $\Delta V$ of change is about 2 V in general, and hence the expression (C) is differentiated with respect to $C_1$ as follows:

$$\frac{d V_0}{d C_1} = 8 \cdot \frac{C_0 - C_1}{C_0^2} - 6 \cdot \frac{C_2}{C_0^2} \qquad (D)$$

$$= \frac{1}{C_0^2}\{8(C_2 + C_3 + C_4) - 6C_2\}$$

$$= \frac{1}{C_0^2}(2C_2 + 8C_3 + 8C_4) > 0$$

From the above expression (D), the potential $V_0$ of the floating gate electrode 7 is increased following increase of the capacitance $C_1$ between the floating gate electrode 7 and the control gate electrode 10, thereby strengthening an electric field between the silicon substrate 1 and the floating gate electrode 7. Therefore, channel hot electron injection can be efficiently caused by this electric field, thereby implementing high-speed writing. If the writing speed is not increased, a voltage applied to the control gate electrode 10 can be reduced, thereby allowing voltage reduction of the device.

Figure 26B:
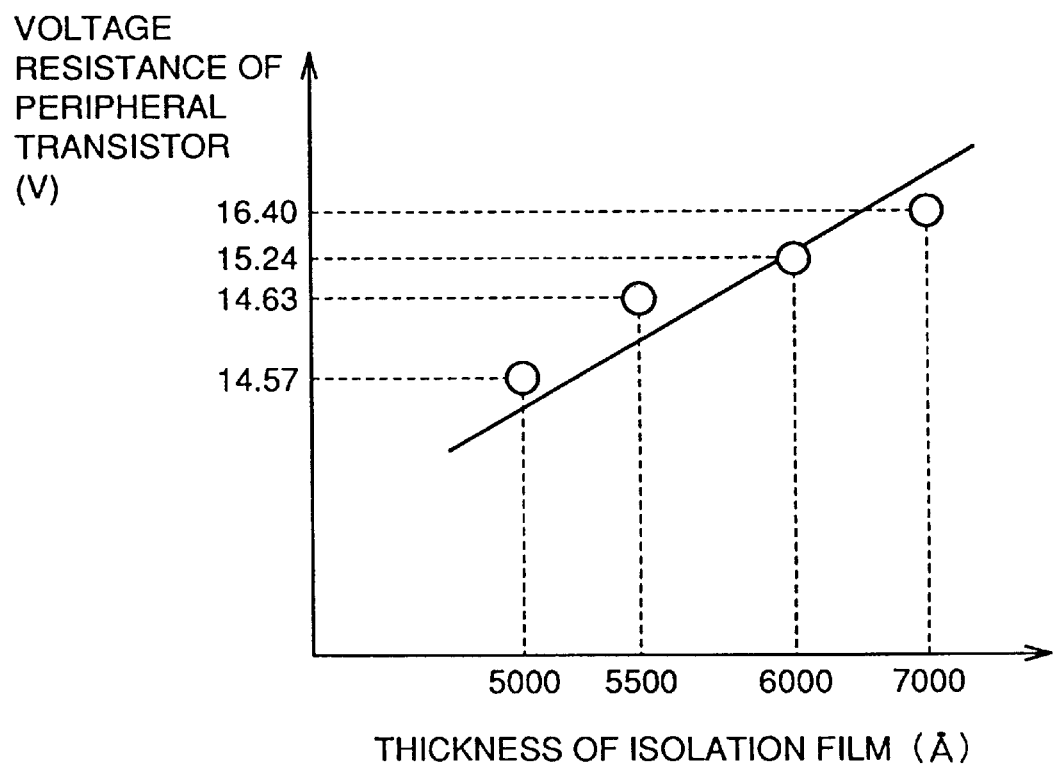
FIG. 26B illustrates the voltage resistance of a LOCOS oxide film.

The depth $D_1$ of the silicon oxide films 6 is smaller than the depth $D_2$ of the LOCOS oxide film 30, whereby the trenches 5 can be readily filled up with the silicon oxide films 6 and the memory region is easy to refine. In the peripheral circuit region, on the other hand, the thickness of the LOCOS oxide film 30 can be ensured and hence the voltage resistance is not reduced. The thickness of the LOCOS oxide film 30 and the voltage resistance are in the relation shown in FIG. 26(B), and hence the thickness can be controlled in response to the voltage resistance.

According to the aforementioned method, the trenches 5 are formed by etching the silicon substrate 1, the silicon oxide film 63 and the doped polysilicon layer 64 in the step shown in FIGS. 8A to 8C, whereby the etching depth is reduced as compared with that in case of forming the trenches 5 by further etching the material for the floating gate electrodes 7. Thus, the trenches 5 are easy to form.

Further, the ONO film 66 is not brought into contact with the p and n wells 31 and 32 in the step shown in FIGS. 10A to 10C, whereby the impurity concentrations of the wells 31 and 32 remain unchanged.

(Embodiment 2)

An embodiment 2 of the present invention provides another method of fabricating the nonvolatile semiconductor memory device shown in FIGS. 1 to 2C.

Referring to FIGS. 27A to 27C, a silicon oxide film 51 of 300 Å in thickness and a silicon nitride film 53 of 2700 Å in thickness are deposited on a surface of a p-type silicon substrate 1. A resist material is applied onto the silicon nitride film 53 and patterned in a prescribed shape for forming a resist pattern 90. The silicon nitride film 53 is etched through the resist pattern 90 serving as a mask. According to the embodiment 2, no doped polysilicon layer 52 is formed dissimilarly to the embodiment 1.

Referring to FIGS. 28A to 28C, a LOCOS oxide film 30 is formed by a LOCOS method. A resist material is applied to cover the overall silicon substrate 1, and patterned in a prescribed shape for forming a resist pattern 91. The silicon nitride film 53, the silicon oxide film 51 and the silicon substrate 1 are etched by Cl/HBr gas through the resist pattern 91 serving as a mask, thereby forming trenches 5 having a depth of 3000 Å as viewed from the surface of the silicon substrate 1. Thereafter the resist pattern 91 is removed.

Referring to FIGS. 29A to 29C, a silicon oxide film 92 is formed to fill up the trenches 5 and cover the overall silicon substrate 1.

Referring to FIGS. 30A to 30C, the overall surface of the silicon oxide film 92 is etched back for forming silicon oxide films 6 at the same height as the silicon nitride film 53. Thereafter the silicon nitride film 53 is removed by CF gas.

Referring to FIGS. 31A to 31C, a resist material is applied to the overall silicon substrate 1 and patterned in a prescribed shape for forming a resist pattern 94. Phosphorus is injected into the silicon substrate 1 with injection energy of 3 MeV at an injection rate of $1.0 \times 10^{13}/cm^2$ as shown by arrows 93 through the resist pattern 94 serving as a mask, for forming a bottom n well 2. Thereafter the resist pattern 94 is removed.

Referring to FIGS. 32A to 32C, a resist material is applied to cover the silicon substrate 1 and patterned in a prescribed shape for forming a resist pattern 95. Phosphorus is injected into the silicon substrate 1 with injection energy of 1.2 MeV at an injection rate of $1.0 \times 10^{13}/cm^2$ as shown by arrows 96 through the resist pattern 95 serving as a mask for forming an n well 32. Further, phosphorus is ion-implanted into the silicon substrate 1 with injection energy of 700 keV at an injection rate of $3.0 \times 10^{12}/cm^2$ through the resist pattern 95 serving as a mask for forming a channel cut region (not shown), while boron is ion-implanted into the silicon substrate 1 with injection energy of 20 keV at an injection rate of $1.5 \times 10^{12}/cm^2$ for forming a counter doped region (not shown). Thereafter the resist pattern 95 is removed.

Figures 33A, 33B, 33C:
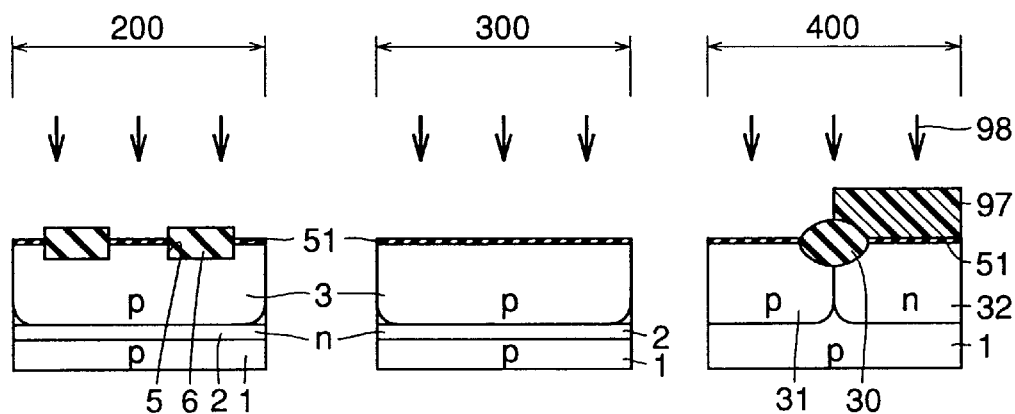
FIGS. 33A to 33C are sectional views showing seventh step of a method of fabricating a nonvolatile semiconductor memory device according to an embodiment 2 of the present invention.

Referring to FIGS. 33A to 33C, a resist material is applied to cover the overall surface of the silicon substrate 1 and patterned in a prescribed shape for forming a resist pattern 97. Boron is injected into the silicon substrate 1 with injection energy of 700 keV at an injection rate of $1.0 \times 10^{13}/cm^2$ as shown by arrows 98 through the resist pattern 97 serving as a mask for forming p wells 3 and 31. Further, boron is ion-implanted into the silicon substrate 1 with injection energy of 270 keV at an injection rate of $3.5 \times 10^{12}/cm^2$ through the resist pattern 97 serving as a mask for forming a channel cut region (not shown), while boron is ion-implanted into the silicon substrate 1 with injection energy of 50 keV at an injection rate of $1.2 \times 10^{12}/cm^2$ for forming a channel doped region (not shown). Thereafter the resist pattern 97 is removed.

Figures 34A, 34B, 34C:
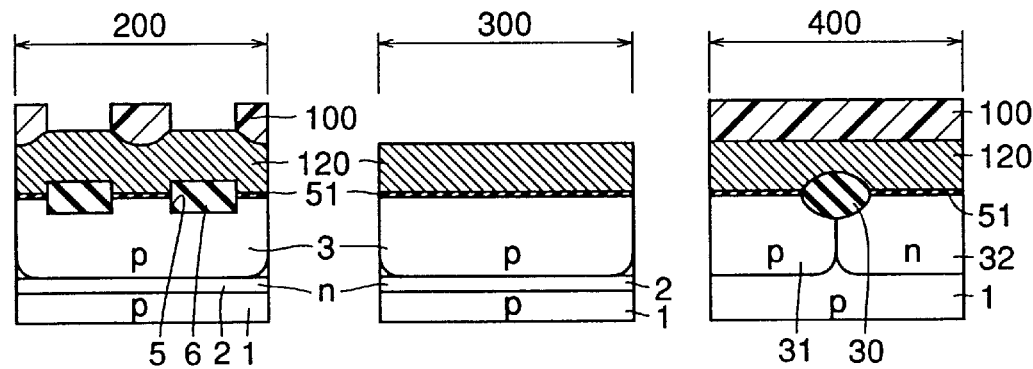
FIGS. 34A to 34C are sectional views showing eighth step of a method of fabricating a nonvolatile semiconductor memory device according to an embodiment 2 of the present invention.

Referring to FIGS. 34A to 34C, a doped polysilicon layer 120 of 1000 Å in thickness is deposited to cover the overall silicon substrate 1. A resist material is applied onto the doped polysilicon layer 120 and patterned in a prescribed shape thereby forming a resist pattern 100. The doped polysilicon layer 120 is etched by Cl gas through the resist pattern 100 serving as a mask, thereby forming the doped polysilicon layer 64 shown in FIG. 9 with reference to the embodiment 1. Subsequent steps are similar to those of the embodiment 1 shown in FIGS. 10A to 25C.

The method of fabricating a nonvolatile semiconductor memory device according to the embodiment 2 has effects similar to those of the embodiment 1. Further, the trenches 5 are formed by etching the silicon nitride film 53, the silicon oxide film 51 and the silicon substrate 1 in the step shown in FIGS. 28A to 28C, whereby the etching depth is reduced as compared with the case of forming the trenches 5 by etching a doped polysilicon layer. Thus, the trenches 5 are easy to form.

(Embodiment 3)

While the nonvolatile semiconductor memory device shown in FIG. 1 has no channel stoppers on bottom portions of the trenches 5, a nonvolatile semiconductor memory device shown in FIGS. 35A to 35C is provided with p-type channel stoppers 26 on bottom portions of trenches 5. The remaining points of the nonvolatile semiconductor memory device shown in FIGS. 35A to 35C are similar in structure to those of the nonvolatile semiconductor memory device shown in FIG. 1.

Figures 36A, 36B, 36C:
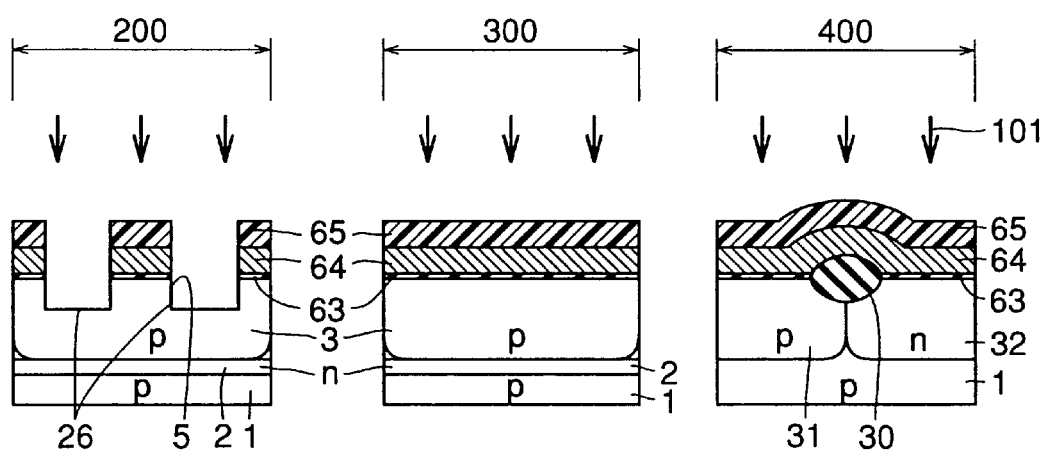
FIGS. 36A to 36C are sectional views showing a method of fabricating the nonvolatile semiconductor memory device shown in FIGS. 35A to 35C according to an aspect of the embodiment 3.

A method of fabricating this nonvolatile semiconductor memory device is now described. Referring to FIGS. 36A to 36C, a LOCOS oxide film 30, a bottom n well 2, p wells 3 and 31, an n well 32, trenches 5, a silicon oxide film 63, a doped polysilicon layer 64 and a resist pattern 65 are formed on a silicon substrate 1 in accordance with the steps of the embodiment 1 shown in FIGS. 3A to 8C. Boron is ion-implanted into bottom portions of the trenches 5 with injection energy of 20 keV at an injection rate of $3.0\times10^{12}/\text{cm}^2$ as shown by arrows 101 through the resist pattern 65 serving as a mask for forming channel stoppers 26. Thereafter steps similar to those of the embodiment 1 are carried out, for completing the nonvolatile semiconductor memory device shown in FIGS. 35A to 35C.

Figures 37A, 37B, 37C:
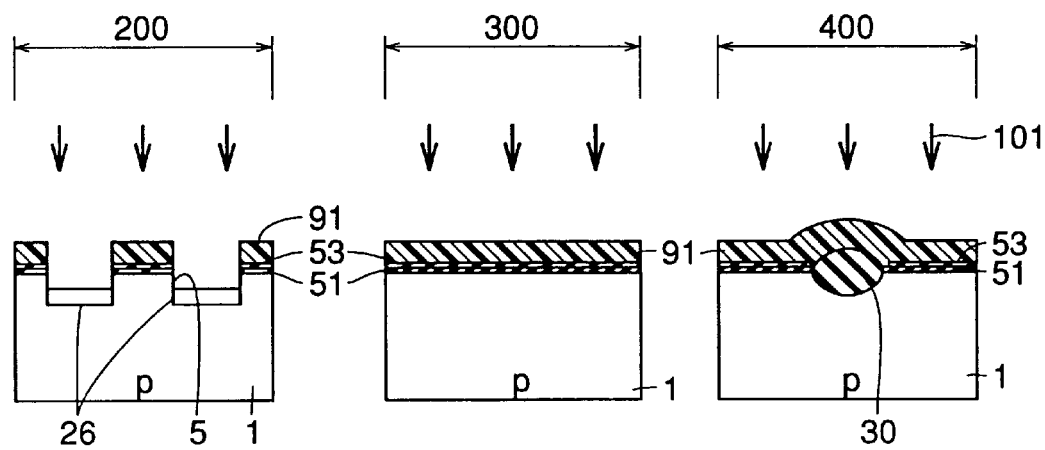
FIGS. 37A to 37C are sectional views showing a method of fabricating the nonvolatile semiconductor memory device shown in FIGS. 35A to 35C according to another aspect of the embodiment 3.

Alternatively, a LOCOS oxide film 30, a silicon oxide film 51, a silicon nitride film 53, a resist pattern 91 and trenches 5 are formed on a silicon substrate 1 in accordance with the steps of the embodiment 2 shown in FIGS. 27A to 28C, as shown in FIGS. 37A to 37C. Boron is ion-implanted into bottom portions of the trenches 5 with injection energy of 20 keV at an injection rate of $3.0\times10^{12}/\text{cm}^2$ as shown by arrows 101 through the resist pattern 91 serving as a mask thereby forming channel stoppers 26. Thereafter steps similar to those of the embodiment 2 are carried out, for completing the nonvolatile semiconductor memory device shown in FIGS. 35A to 35C.

In the methods of fabricating nonvolatile semiconductor memory devices along such steps, effects similar to those of the methods according to the embodiments 1 and 2 are attained. Further, the channel stoppers 26 are formed on the bottom portions of the trenches 5, whereby isolation ability for the trenches 5 is further improved.

Further, the channel stoppers 26 are formed in deep positions as viewed from the surface of the silicon substrate 1, thereby exerting no influence on impurity regions formed on the surface of the silicon substrate 1 and reducing no voltage resistance.

(Embodiment 4)

Figure 38A:
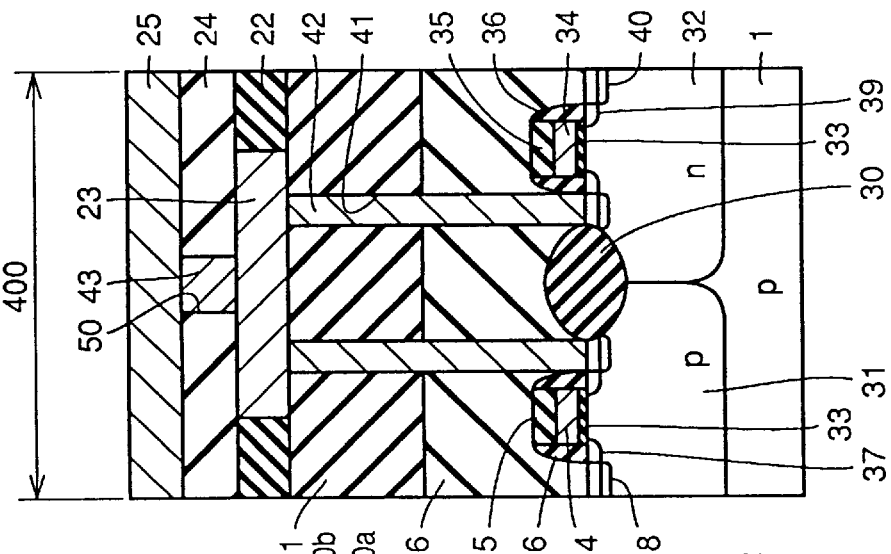
FIGS. 38A to 38C are sectional views showing a nonvolatile semiconductor memory device according to an embodiment 4 of the present invention.
Figure 38B:
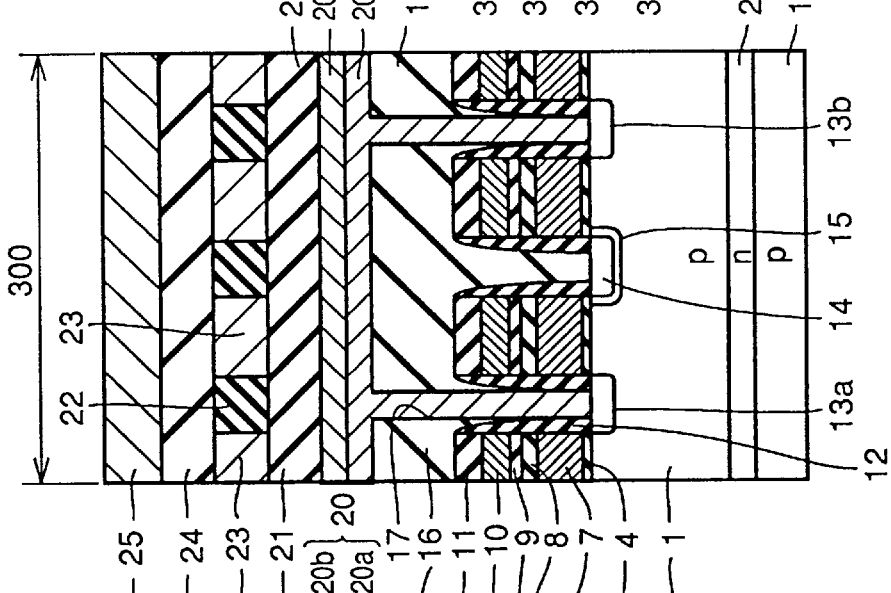
Figure 38C:
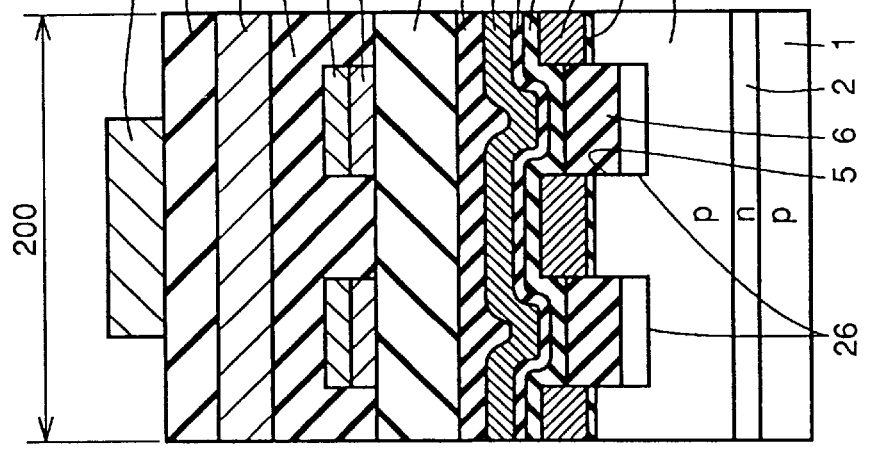

While the p well 3 is formed on the bottom n well 2 in the nonvolatile semiconductor memory device shown in FIGS. 2A to 2C, a nonvolatile semiconductor memory device shown in FIGS. 38A to 38C are provided with no p well 3. The remaining structures of the nonvolatile semiconductor memory device shown in FIGS. 38A to 38C are similar to those of the nonvolatile semiconductor memory device shown in FIGS. 2A to 2C.

Figures 39A, 39B, 39C:
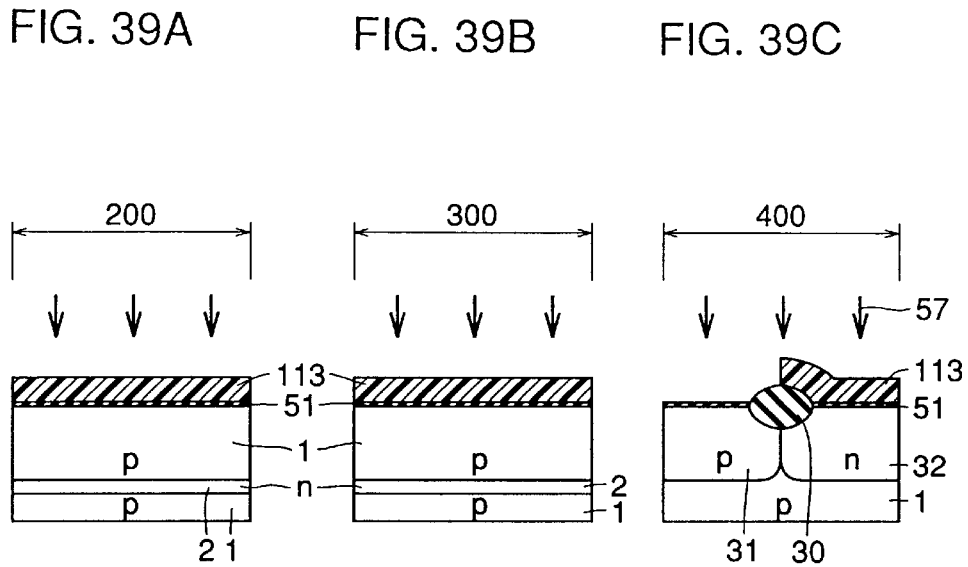
FIGS. 39A to 39C are sectional views showing a method of fabricating the nonvolatile semiconductor memory device shown in FIGS. 38A to 38C according to an aspect of the embodiment 4.

A method of fabricating the nonvolatile semiconductor memory device shown in FIGS. 38A to 38C are now described. Referring to FIGS. 39A to 39C, a bottom n well 2, a LOCOS oxide film 30, a silicon oxide film 51 and an n well 32 are formed on a silicon substrate 1, in accordance with the steps of the embodiment 1 shown in FIGS. 3A to 5C. A resist material is applied to cover the silicon substrate 1 and patterned in a prescribed shape thereby forming a resist pattern 113. This resist pattern 113 covers regions 200 and 300, and a part of a region 400. Phosphorus is injected into the silicon substrate 1 through the resist pattern 113 serving as a mask similarly to the embodiment 1, thereby forming a p well 31. Thereafter the steps of the embodiment 1 shown in FIGS. 7A to 25C are carried out, for completing the nonvolatile semiconductor memory device shown in FIGS. 38A to 38C.

Figures 40A, 40B, 40C:
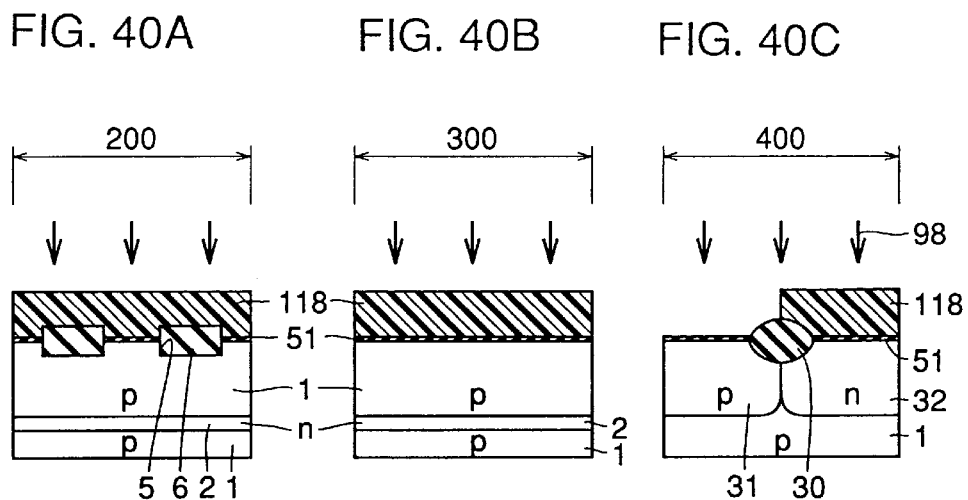
FIGS. 40A to 40C are sectional views showing a method of fabricating the nonvolatile semiconductor memory device shown in FIGS. 38A to 38B according to another aspect of the embodiment 4.

Alternatively, a bottom n well 2, an n well 32, a LOCOS oxide film 30, a silicon oxide film 51, trenches 5 and silicon oxide films 6 are formed on a silicon substrate 1 along the steps of the embodiment 2 shown in FIGS. 27A to 32C, as shown in FIGS. 40A to 40C. Then, a resist material is applied to cover the overall silicon substrate 1 and patterned in a prescribed shape for forming a resist pattern 118. The resist pattern 118 covers overall regions 200 and 300 and a part of a region 400. Boron is injected into the silicon substrate 1 as shown by arrows 98 through the resist pattern 118 serving as a mask similarly to the embodiment 2, thereby forming a p well 31. Thereafter steps similar to those of the embodiment 2 shown in FIGS. 34A to 34C and the embodiment 1 shown in FIGS. 10A to 25C are carried out, for completing the nonvolatile semiconductor memory device shown in FIGS. 38A to 38C.

Such a nonvolatile semiconductor memory device attains effects similar to those of the embodiments 1, 2 and 3. Neither well nor channel doped region is formed on a memory cell region, whereby source-to-drain voltage resistance is further improved.

Figures 41A, 41B, 41C:
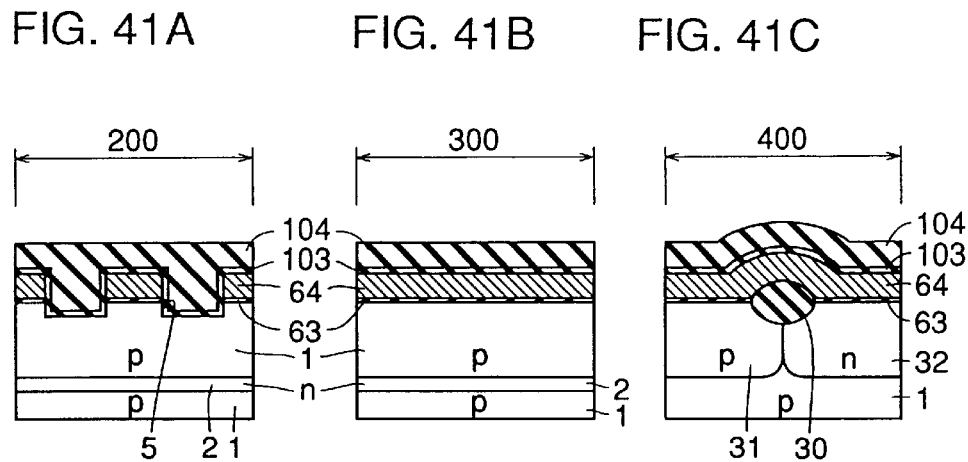
FIGS. 41A to 41C are sectional views showing a method of fabricating a nonvolatile semiconductor memory device according to an aspect of an embodiment 5 of the present invention.
Figure 42A:
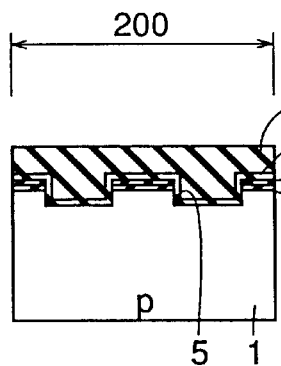
FIGS. 42A to 42C are sectional views showing a method of fabricating a nonvolatile semiconductor memory device according to another aspect of the embodiment 5 of the present invention.
Figure 42B:
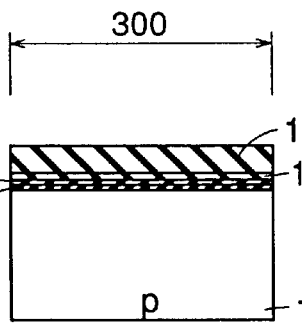
Figure 42C:
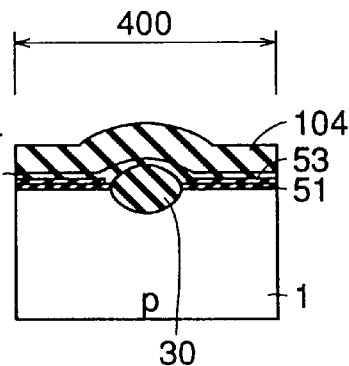
Figure 43:
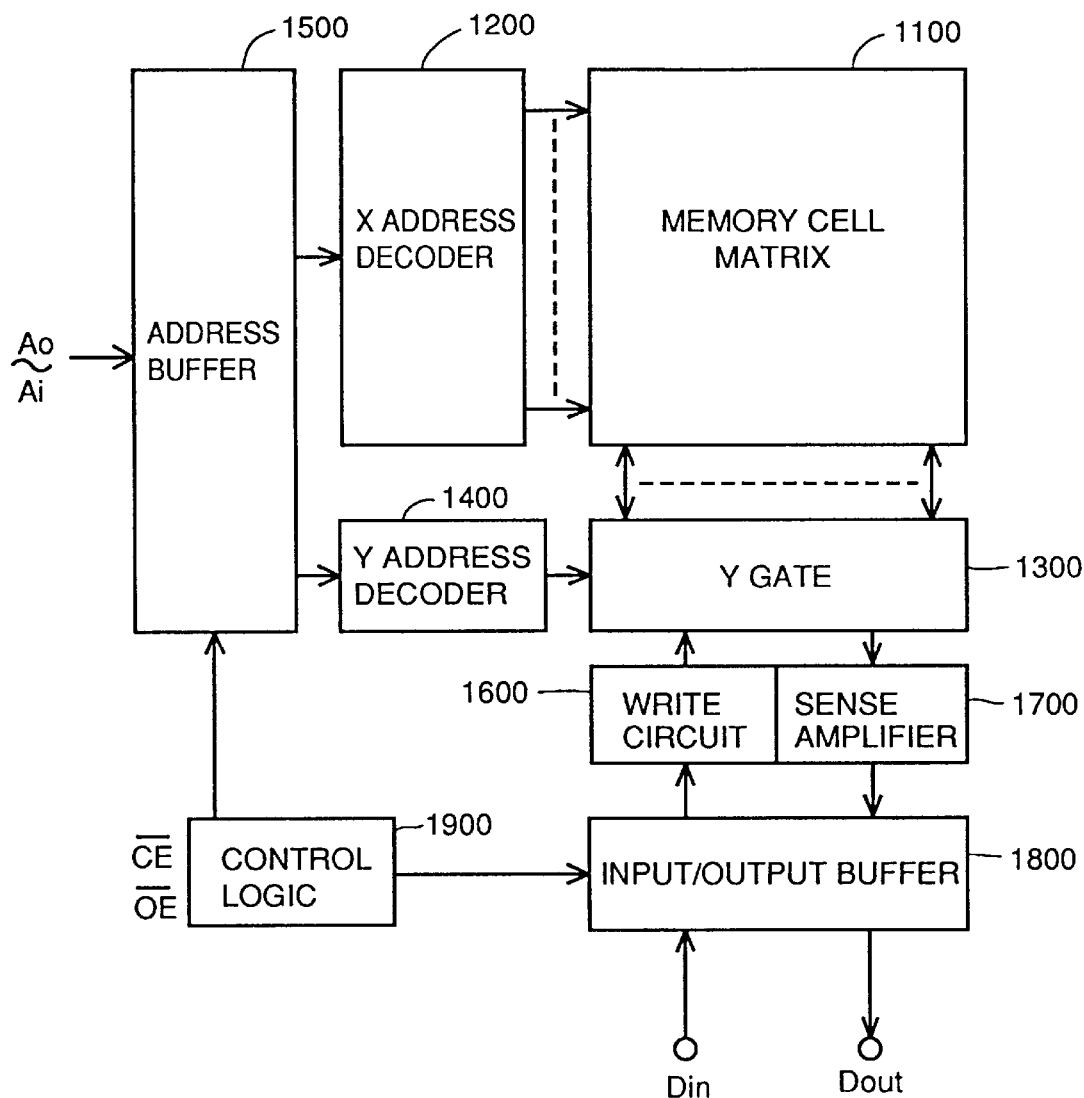
FIG. 43 is a block diagram showing the structure of a conventional general flash memory.
Figure 44:
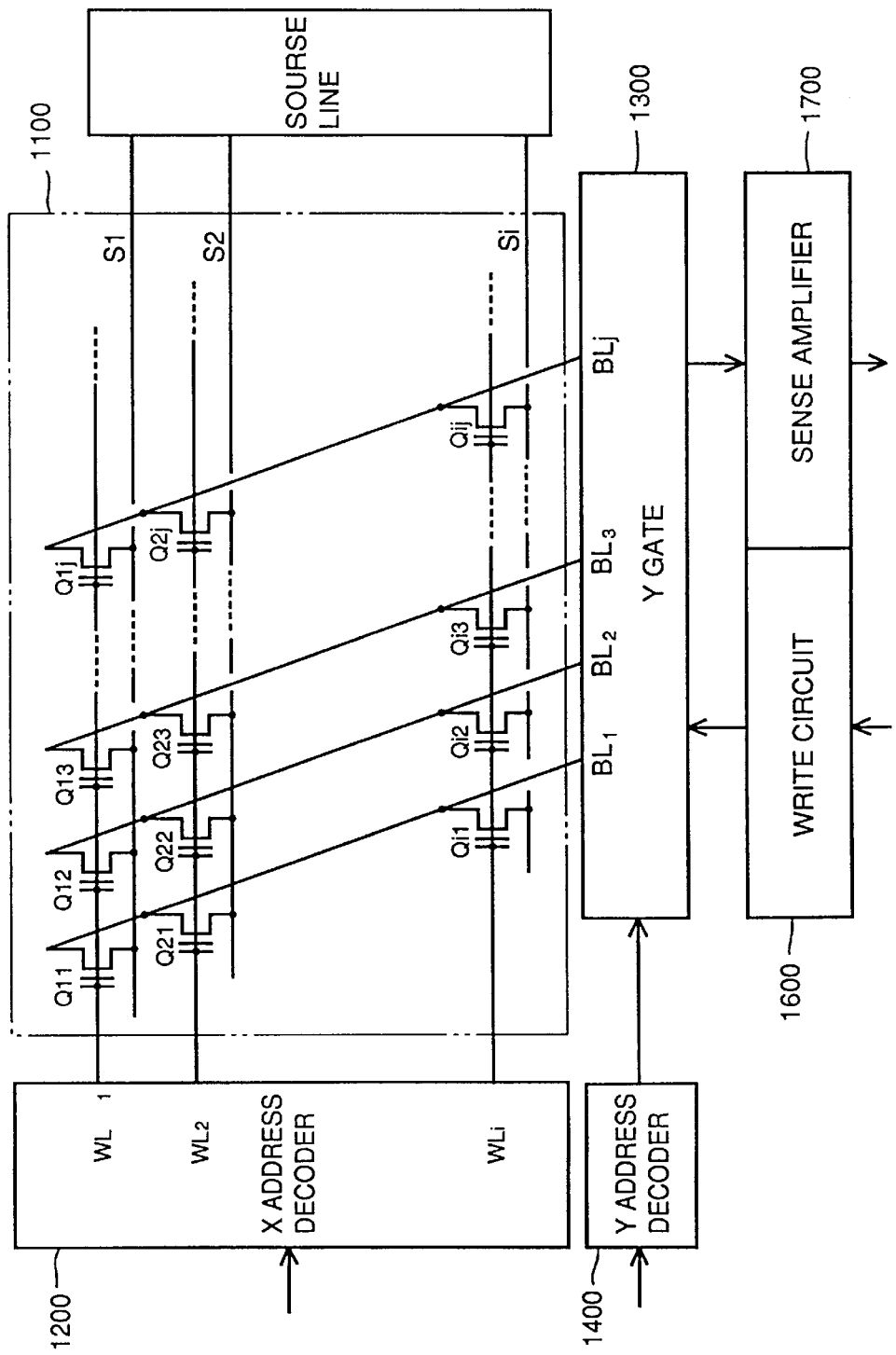
FIG. 44 is an equivalent circuit diagram showing a schematic structure of a memory cell matrix shown in FIG. 43.
Figure 45:
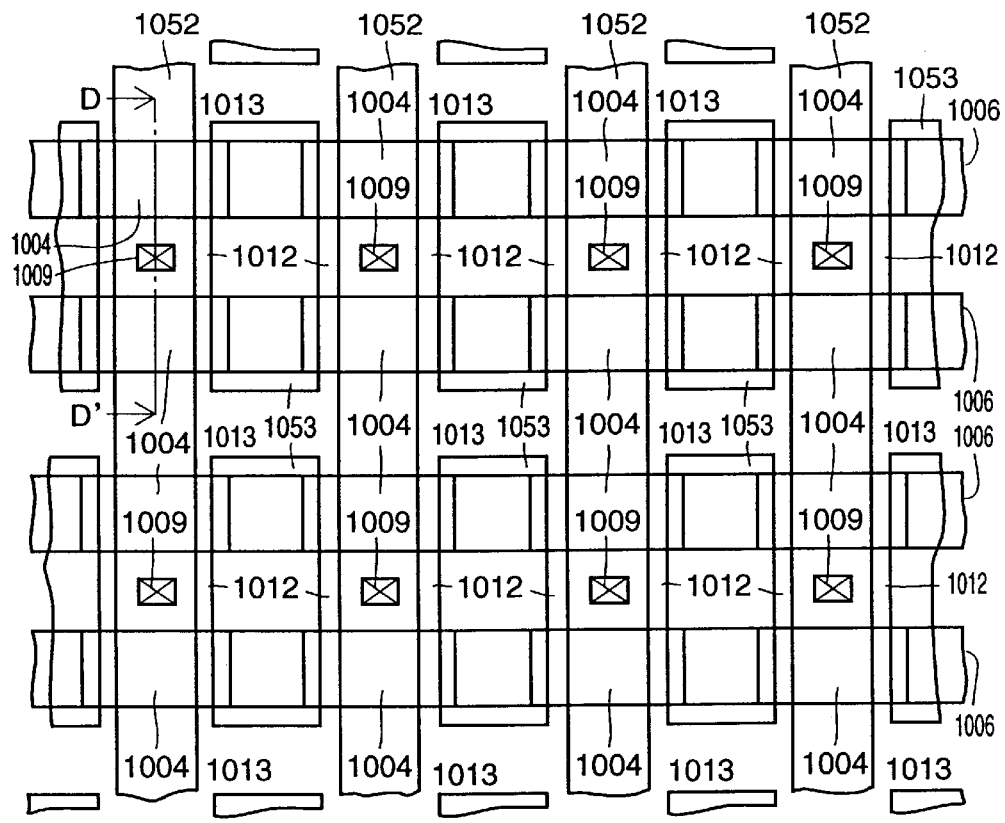
FIG. 45 is a partial plan view showing a schematic structure of the memory cell matrix of the conventional flash memory.
Figure 46:
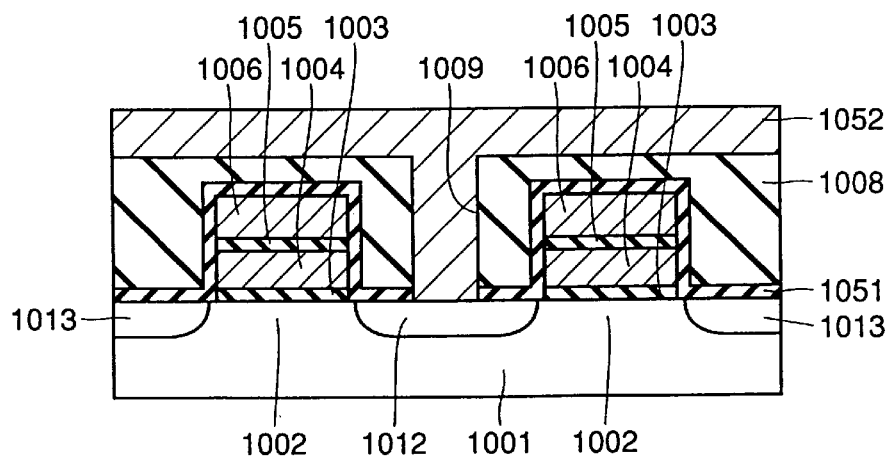
FIG. 46 is a sectional view taken along the line D–D' in FIG. 45.
Figure 47:
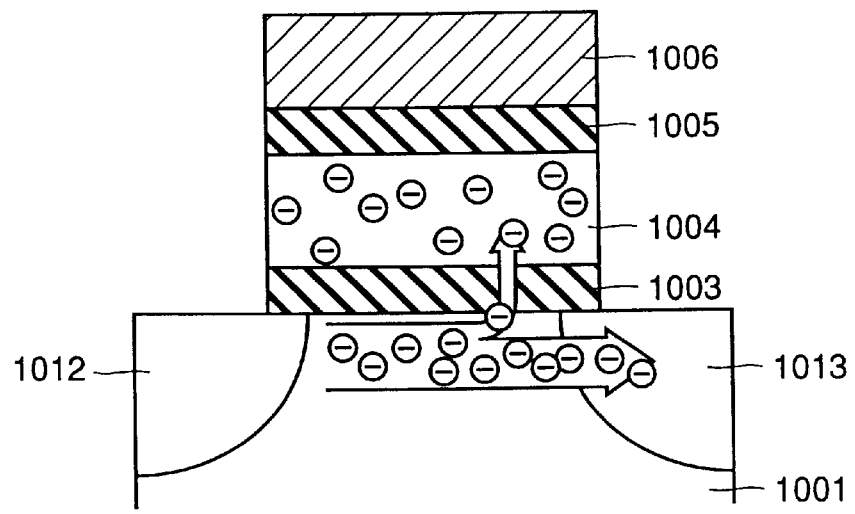
FIG. 47 is adapted to illustrate a write operation of a flash EEPROM utilizing channel hot electrons.
Figure 48:
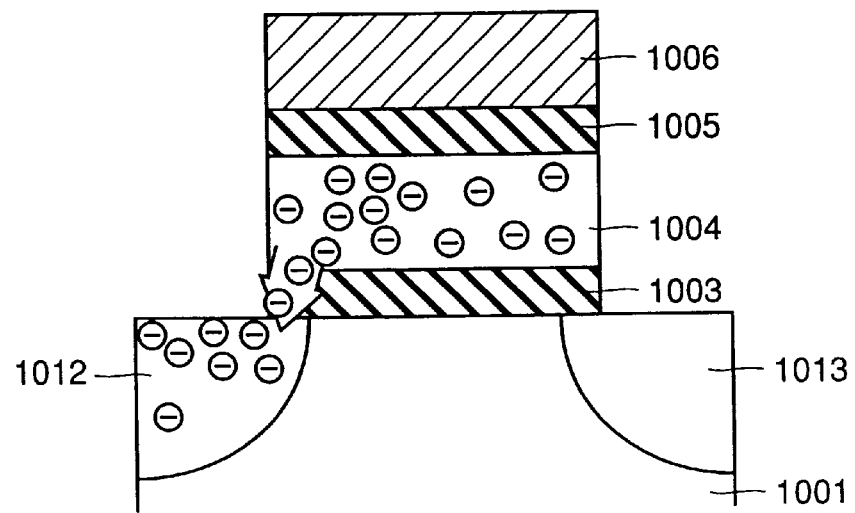
FIG. 48 is adapted to illustrate an erase operation utilizing an F-N tunnel phenomenon.
Figure 49:
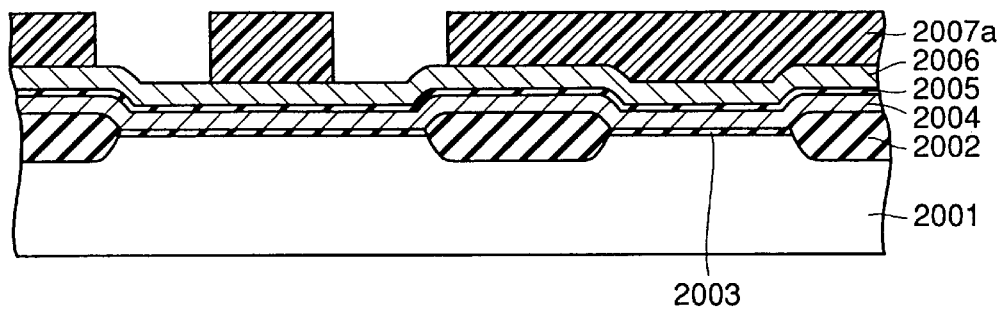
FIG. 49 is a sectional view showing a first step of a conventional method of fabricating a nonvolatile semiconductor memory device.
Figure 50:
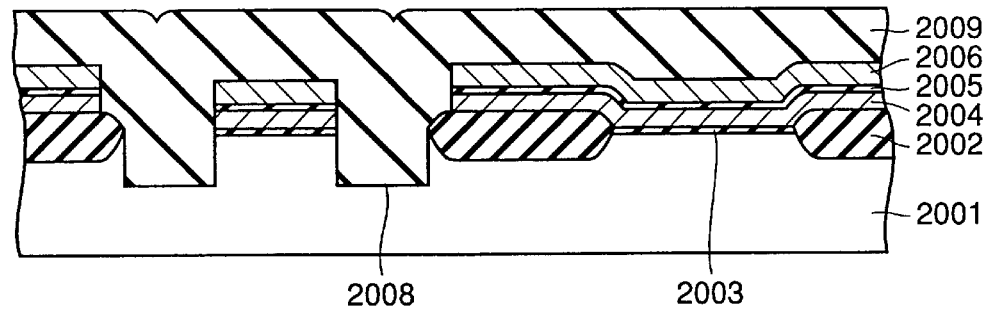
FIG. 50 is a sectional view showing a second step of the conventional method of fabricating a nonvolatile semiconductor memory device.
Figure 51:
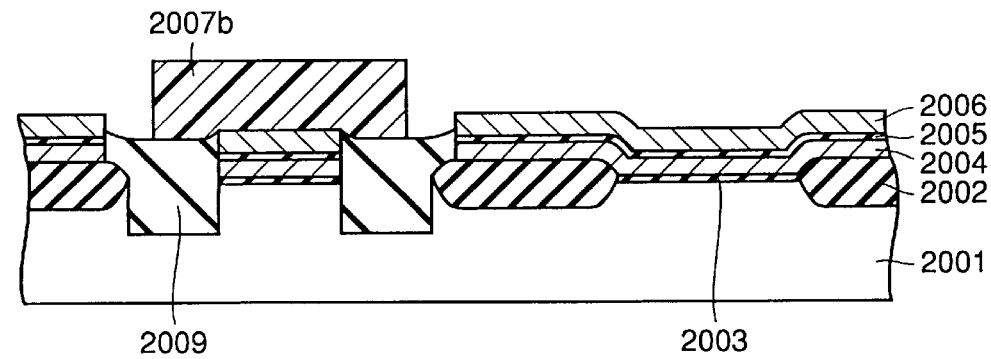
FIG. 51 is a sectional view showing a third step of the conventional method of fabricating a nonvolatile semiconductor memory device.
Figure 52:
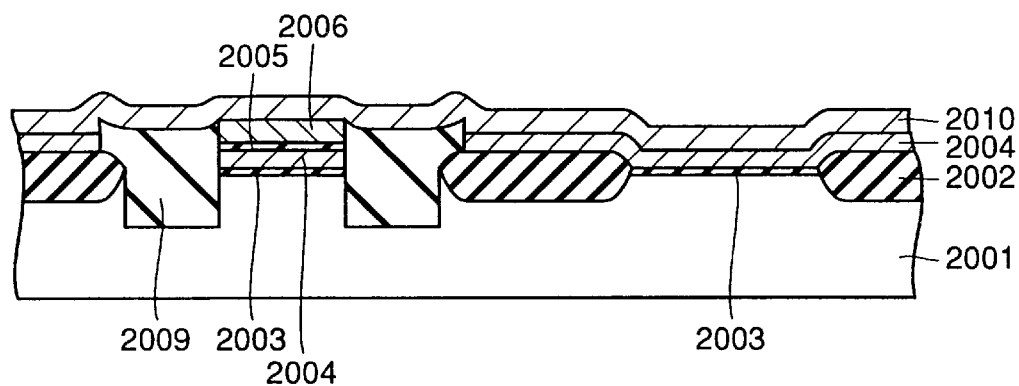
FIG. 52 is a sectional view showing a fourth step of the conventional method of fabricating a nonvolatile semiconductor memory device.
Figure 53:
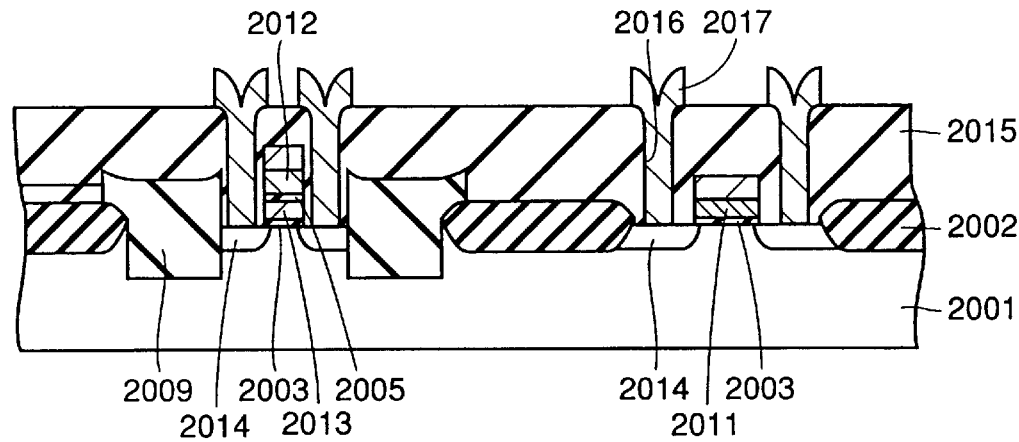
FIG. 53 is a sectional view showing a fifth step of the conventional method of fabricating a nonvolatile semiconductor memory device.

(Embodiment 5) Referring to FIGS. 41A to 41C, a thermal oxide film 103 of 100 Å in thickness is formed to cover surfaces of trenches 5 when silicon oxide films 6 are buried in the trenches 5 in an embodiment 5 of the present invention in a step similar to that of the embodiment 1 shown in FIGS. 9A to 9C, and a silicon oxide film 104 is formed on the thermal oxide film 103 by CVD. The overall surfaces of these oxide films 103 and 104 are etched back thereby forming the silicon oxide films 6. Alternatively, a thermal oxide film 103 and a silicon oxide film 104 are formed when silicon oxide films 6 are buried in trenches 5 in a step similar to that of the embodiment 2 shown in FIGS. 29A to 29C, and etched back for forming the silicon oxide films 6, as shown in FIGS. 42A to 42C.

According to such methods, effects similar to those of the embodiments 1 to 3 are first attained. Even if crystal defects are caused in parts of silicon substrates 1 etched for forming the trenches 5, further, these crystal defects are eliminated in formation of the thermal oxide films 103, and leakage currents are reduced. Thus, isolation is further reliably performed by the trenches 5 and the silicon oxide films 6.

The embodiments of the present invention which have been described can be modified in various ways. While all wells are formed as retrograde wells in the aforementioned embodiments, similar effects can be attained by thermal diffusion wells. Further, materials forming the respective films and the thicknesses thereof can be changed at need. Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising a memory cell array including a plurality of nonvolatile transistors for storing information and a peripheral circuit including a plurality of semiconductor elements for controlling operations of said memory cell array being formed on a semiconductor substrate having a major surface, wherein each of said plurality of nonvolatile transistors comprises:
a floating gate electrode, having an upper surface, being formed on said semiconductor substrate with an insulating film interposed therebetween, and
a control gate electrode being formed on said floating gate electrode with an insulating film interposed therebetween and continuously extending in a prescribed arrangement direction of said memory cell array, said memory cell array includes:
a trench for electrically isolating said plurality of nonvolatile transistors, being adjacent each other along the longitudinal direction of said control electrode, formed on said major surface of said semiconductor substrate from each other, and
an insulating layer, filling up said trench, having an upper surface projecting upward beyond said major surface of said semiconductor substrate, wherein:

said upper surface of said insulating layer is positioned at a height between upper and lower surfaces of each said floating gate electrode,
said control gate electrode is formed on said insulating film and extends along overall said upper surface and portions close to upper ends of side surfaces of said floating gate electrode and said upper surface of said insulating layer, and
said plurality of semiconductor elements are electrically isolated from each other by a LOCOS oxide film.

2. The nonvolatile semiconductor memory device in accordance with claim 1, wherein a bottom surface of said LOCOS oxide film as viewed from said major surface of said semiconductor substrate is deeper than that of said trench as viewed from said major surface of said semiconductor substrate.

3. The nonvolatile semiconductor memory device in accordance with claim 1, wherein a channel stopper is formed on a part of said semiconductor substrate being in contact with a bottom surface of said trench.

* * * * *